United States Patent [19]

Suenaga et al.

[11] Patent Number: 4,900,989
[45] Date of Patent: Feb. 13, 1990

[54] MAGNETRON FEEDING APPARATUS AND METHOD OF CONTROLLING THE SAME

[75] Inventors: Haruo Suenaga, Soraku; Naoyoshi Maehara, Shiki; Kazuho Sakamoto, Soraku; Takahiro Matsumoto; Takashi Niwa, both of Ikoma; Daisuke Bessyo, Yamatokoriyama, all of Japan

[73] Assignee: Matsushita Electric Industrial Co., Ltd., Osaka, Japan

[21] Appl. No.: 189,166

[22] Filed: May 2, 1988

[30] Foreign Application Priority Data

Apr. 30, 1987 [JP] Japan .................................. 62-106636
May 14, 1987 [JP] Japan .................................. 62-117339
May 14, 1987 [JP] Japan .................................. 62-117344

[51] Int. Cl.$^4$ .......................................... H05B 41/36
[52] U.S. Cl. .................... 315/224; 315/106; 315/219; 315/308
[58] Field of Search ............... 315/101, 105, 106, 107, 315/209, 219, 224, 308

[56] References Cited

U.S. PATENT DOCUMENTS 4,076,996 2/1978 Maehara et al. ..................... 315/106
4,481,447 11/1984 Stupp et al. ......................... 315/101
4,835,353 5/1989 Smith et al. ..................... 315/105 X Primary Examiner—David Mis
Attorney, Agent, or Firm—Wenderoth, Lind & Ponack

[57] ABSTRACT

A magnetron feeding apparatus includes an inverter circuit for converting DC power into high-frequency power; a high-tension transformer for converting the high-frequency power into high-tension power to be supplied to the magnetron; an output voltage detector for detecting the output voltage of the high-tension transformer; an input current detector for detecting the input current into the inverter circuit; a power controller for controlling the operation of the inverter circuit in response to the output voltage detected by the output voltage detector and the input current detected by the input current detector.

19 Claims, 22 Drawing Sheets

MAGNETRON FEEDING APPARATUS AND METHOD OF CONTROLLING THE SAME

BACKGROUND OF THE INVENTION

The present invention generally relates to improvements in a high-frequency heating apparatus for heating food, liquid or the like by a so-called dielectric heating, and more particularly, to a magnetron feeding apparatus and a method of controlling the magnetron feeding apparatus which is adapted to effect a feeding operation to a magnetron by an inverter circuit using a semiconductor switch and a high-tension transformer.

Generally, a magnetron feeding apparatus shown in FIG. 1 is adapted to convert a DC current 2 from a power supply portion 1 into high-frequency power 5 by an inverter circuit 4 using a semiconductor switch 3 such as a transistor, and furthermore to convert into high-tension power 7 by a high-tension transformer 6 to feed the power to a magnetron 8.

Also, a method of controlling the feeding power comprises steps of detecting the input current from a commercial power supply 9 by an input detecting portion 10, and forming the difference 12 between its value and a reference signal 11 by an error amplification circuit 13; a driving circuit 14 generates a driving pulse 15 corresponding to the difference 12 so as to turn the semiconductor switch on and off, so that the input current is controlled to be a given value.

However, as most of the power to be fed to the magnetron 8 is consumed only by a heater $8_H$ before the magnetron 8 starts its oscillation, the power feeding operation will be approximately one-seventh of feed power at the steady-state time when the magnetron 8 is oscillating.

Namely, if the input current is controlled to the given value in a period before the magnetron 8 starts its oscillation, the excessive power is applied on the heater $8_H$ and also the excessive voltage is applied upon between the anode $8_A$ and the cathode $8_K$, thus resulting in the life service of the magnetron 8 being shorter because of discharging, deteriorated insulation, etc.

The reference signal 11 is set to a value smaller at the steady-state time before the magnetron 8 starts its oscillation so as to be controlled to small input current which is proper to the heater heating operation. By using a timer 16, the reference signal 11 is switched to the value at the steady-state time after the lapse of the time sufficient enough for the magnetron 8 to start its oscillation, so that the input current may be controlled to a value at the steady-state time.

As time required for the oscillation to be started is two seconds when the magnetron 8 is kept warm, four seconds when it is kept cold, the time for the timer 16 is set as five seconds for safety.

As the wave output of the magnetron 8 is not produced for five seconds, a wasteful time of 5−2=3 seconds is consumed when the magnetron 8 is kept warm, while a wasteful time of 5−4=1 second is consumed when the magnetron 8 is kept cold, with inconvenience that high-speed cooking capability which is characterized by the electronic range is deteriorated.

SUMMARY OF THE INVENTION

Accordingly, an essential object of the present invention is to provide a magnetron feeding apparatus, which is capable of controlling the output voltage of the high-tension transformer and the input current to the inverter circuit.

Another important object of the present invention is to provide a magnetron feeding apparatus which is capable of reaching so far as the oscillable condition of the magnetron within a shorter time, because a large voltage, i.e., as much power as is possible may be provided without the application of excessive voltage to the magnetron in a period before the magnetron starts its oscillation, namely, when the output voltage of the high-tension transformer is large in spite of a small input current to the inverter circuit.

A further object of the present invention is to provide a magnetron feeding apparatus of the above-described type in which the controlling operation is effected so that the input current may reach its given value with the result that the starting operation may be effected without consumption of a wasteful time to the oscillating condition of the magnetron or the oscillating condition may be stably continued, because the input current to the inverter circuit is rapidly increased although the output voltage of the high-tension transformer has an excessive voltage for one second or less, with the magnetron being an extremely low impedance load under constant application of voltage when the oscillable condition is reached.

In accomplishing these and other objects, according to the preferred embodiments of the present invention, there is provided a magnetron feeding apparatus, which includes a power-supply portion for feeding DC current, an inverter circuit for converting the DC power into high-frequency power by the switching operation of a semiconductor switch, a high-tension transformer for converting the high-frequency power into high-tension power to be supplied to the magnetron, an output voltage detector for detecting the output voltage of the high-tension transformer, an input current detector for detecting the input current to the converter circuit, a power controller for controlling the switching operation of the semiconductor switch in response to the output voltage detected by the output voltage detector and the input current detected by the input current detector.

By the arrangement of the present invention as described above, an improved magnetron feeding apparatus removes the above-described wasteful time without lowering the service life of the magnetron.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
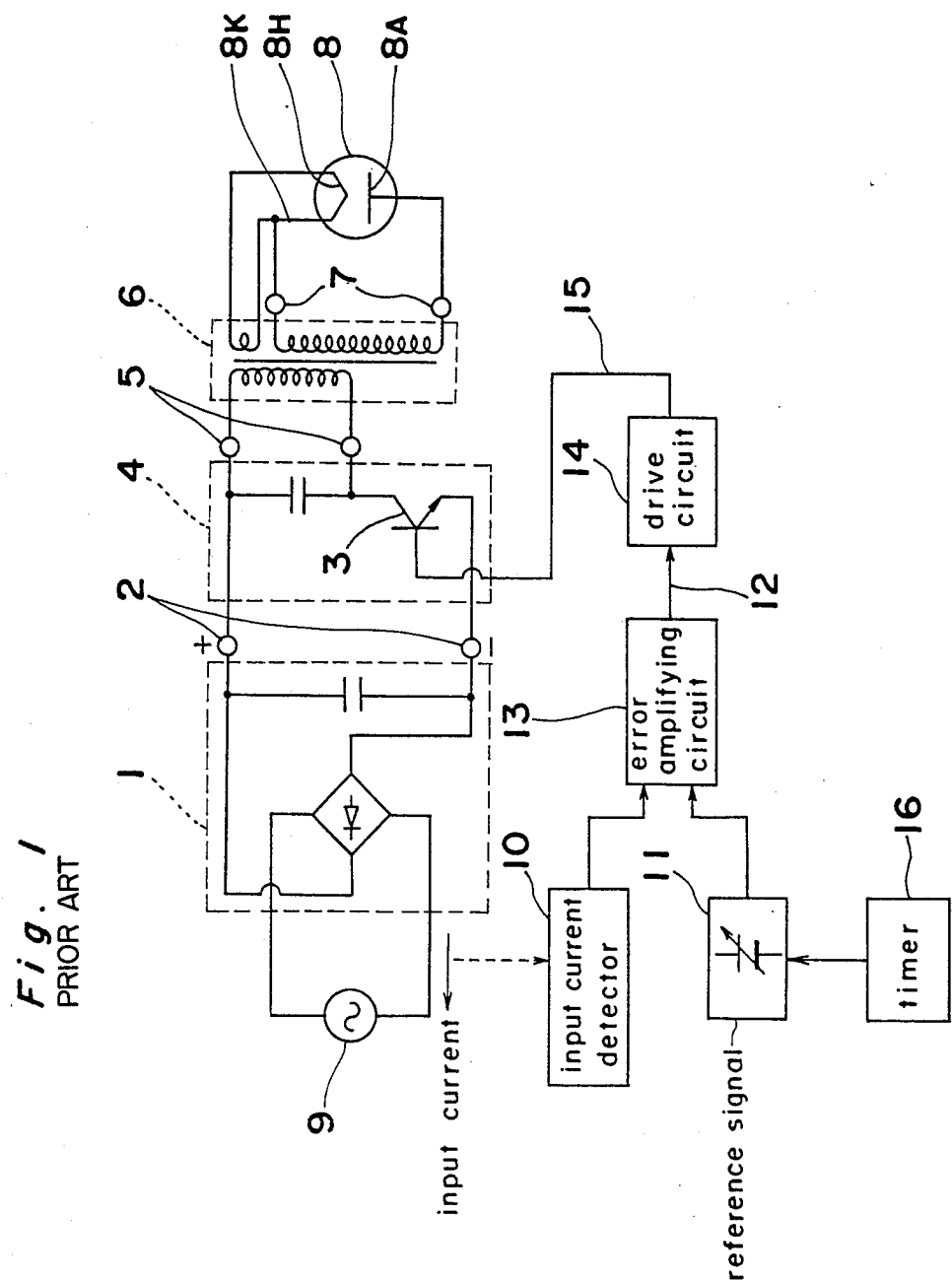
FIG. 1 is a block diagram of a conventional magnetron feeding apparatus.

Before the description of the present invention proceeds, it is to be noted that like parts are designated by like reference numerals throughout the accompanying drawings.

Figure 2:
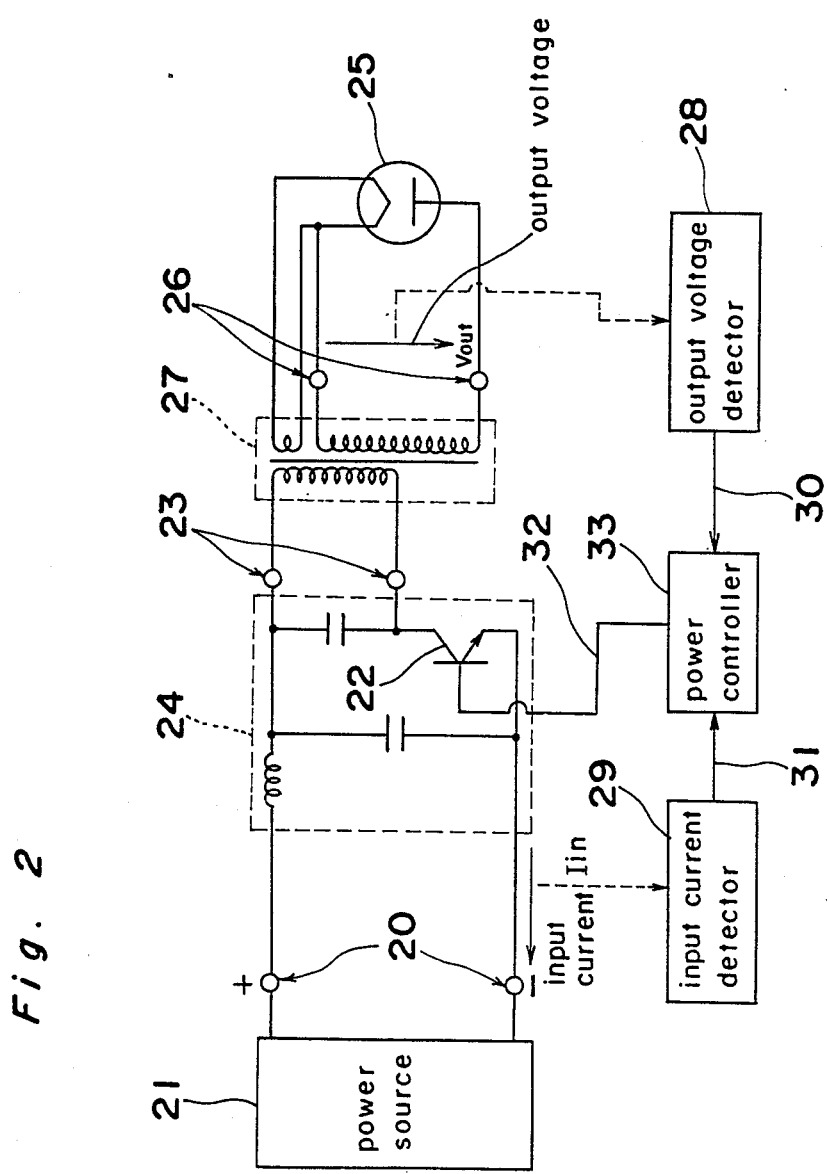
FIG. 2 is a construction conceptional diagram of a magnetron feeding apparatus of the present invention.

Referring now to the drawings, there is shown in FIG. 2 a magnetron feeding apparatus of the present invention, which includes a power supply 21 for feeding DC current 20, an inverter circuit 24 which switches in high frequency the DC power supply 20 by a semiconductor switch 22 to convert it into high-frequency power 23, a high-tension transformer 27 which converts the high-frequency power 23 into the high-tension power 26 necessary for the operation of a magnetron 25, an output voltage detector 28 which detects the output voltage $V_{OUT}$ of the high-tension transformer 27, an input current detector 29 which detects the input current $I_{IN}$ into the inverter circuit 24, a power controller 33 for controlling the switching operation of an inverter circuit 24 through the outputting of driving pulses 32 which turn the semiconductor switch 22 on and off using the output voltage 30 of the output voltage detector 28 and the input current 31 of the input current detector 29.

Figure 3:
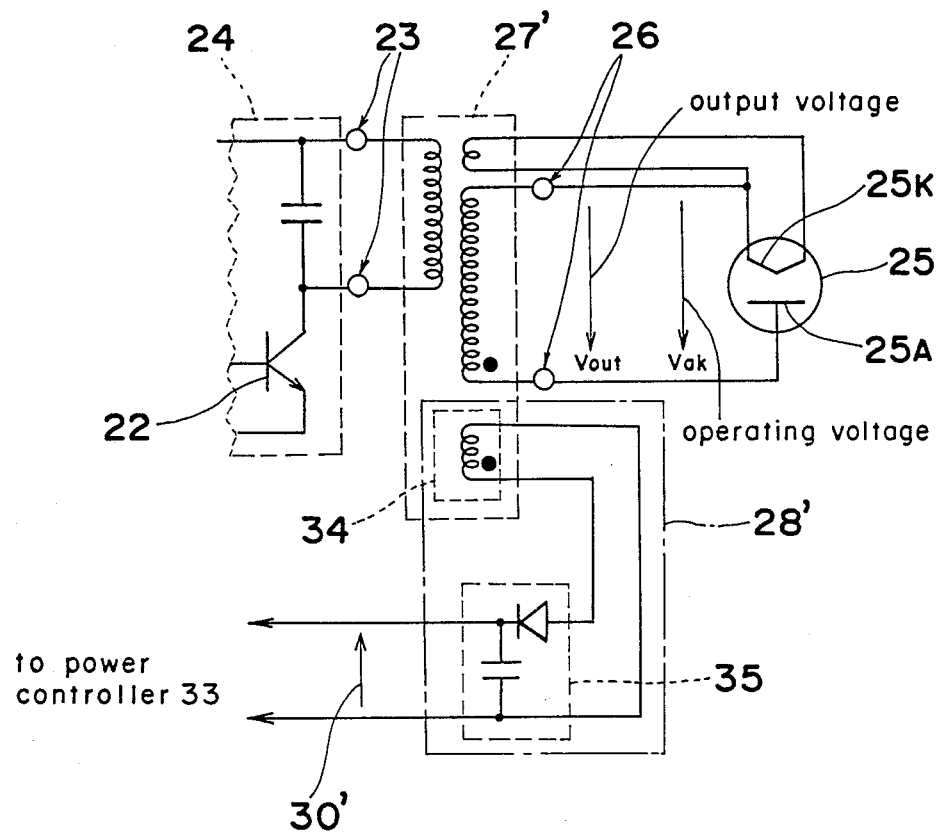
FIG. 3 is a block diagram of a first embodiment of an output voltage detector of the present invention.

FIG. 3 is a construction diagram of a first embodiment of an output voltage detector 28'. Referring to FIG. 3, an exclusive detection winding 34 is provided on the output (secondary) side of the high-tension transformer 27', with the output thereof being adapted to be outputted by the conversion into the output 30' through a first rectification circuit 35. In such a construction as described hereinabove, the output voltage 30' corresponding to the output voltage $V_{OUT}$ may be provided.

Figure 4:
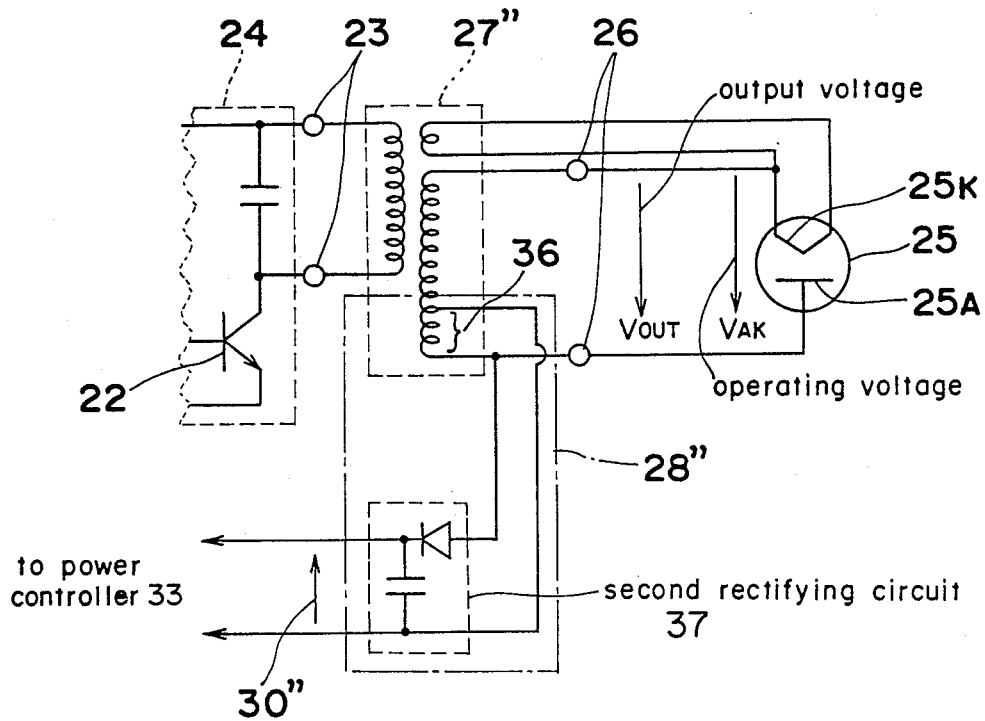
FIG. 4 is a block diagram of a second embodiment of an output voltage detector of the present invention.

FIG. 4 is a construction diagram of a second embodiment of an output voltage detector 28". Referring to FIG. 4, a detecting winding 36 which uses in combination one portion of the winding of the output (secondary) side of the high-tension transformer 27" is provided, with the output thereof being adapted to be outputted by the conversion into the output voltage 30" corresponding to the output voltage $V_{OUT}$ through a second rectification circuit 37.

Since the polarity of the operation voltage $V_{AK}$ of the magnetron 25 is such that the cathode $25_K$ becomes minus in electric potential with respect to the anode $25_A$, the detection windings 34 and 36, and the rectification circuits 35 and 37 and the and output voltage information 30' and 30" are polarized as shown in FIG. 3 and FIG. 4.

Figure 5:
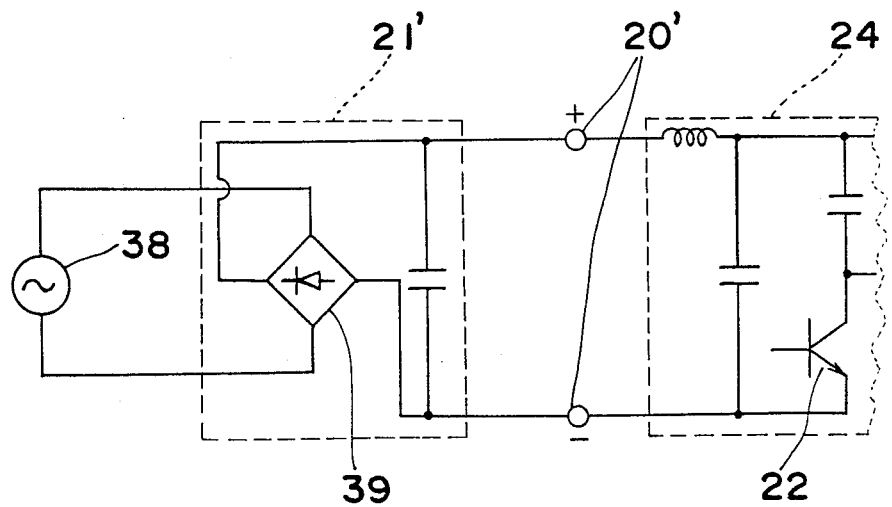
FIG. 5 is a block diagram of a first embodiment of a power supply of the present invention.

FIG. 5 is a construction diagram of a first embodiment of a power supply 21'. Referring to FIG. 5, the DC power 20' to be fed to the inverter circuit 24 is adapted to get commercial power 38 through a third rectification circuit 39.

Figure 6:
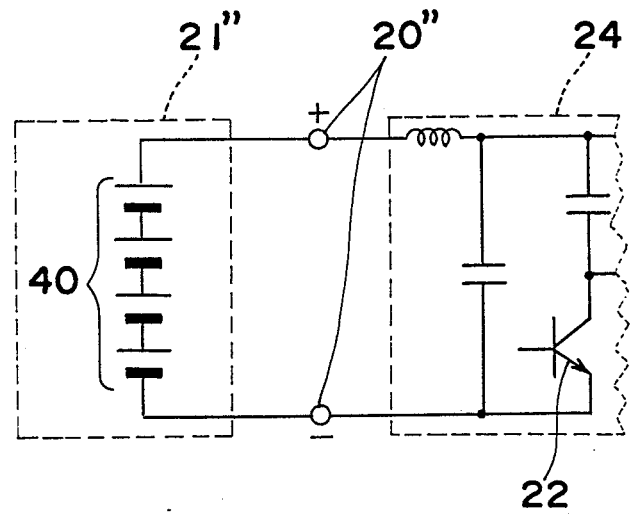
FIG. 6 is a block diagram of a second embodiment of a power supply of the present invention.

FIG. 6 is a construction diagram showing a second embodiment of a power-supply 21". Referring to FIG. 6, DC current 20" to be fed to the inverter circuit 24 is adapted to be provided from a battery 40.

Figure 7:
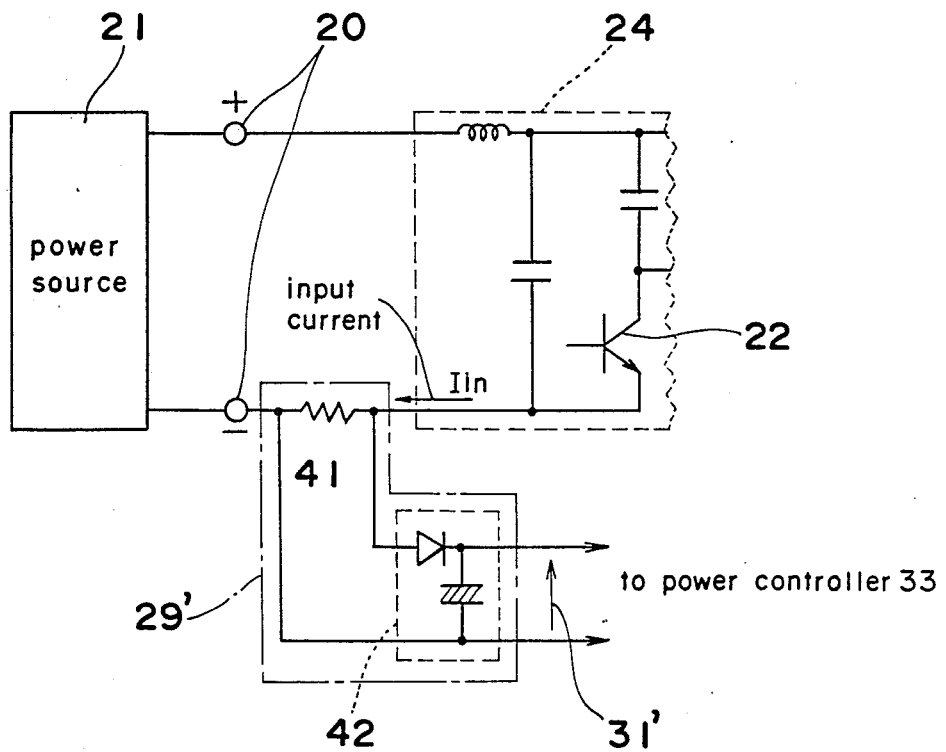
FIG. 7 is a block diagram of a first embodiment of an input current detector of the present invention.

FIG. 7 is a block diagram showing the first embodiment of an input current detector 29'. Referring to FIG. 7, a current detection resistor 41 is inserted into between the power supply 21 and the inverter circuit 24 so as to convert the voltage across the ends thereof into an input current 31' through a fourth rectification circuit 42 so that information corresponding to the input current $I_{IN}$ may be inputted.

Figure 8:
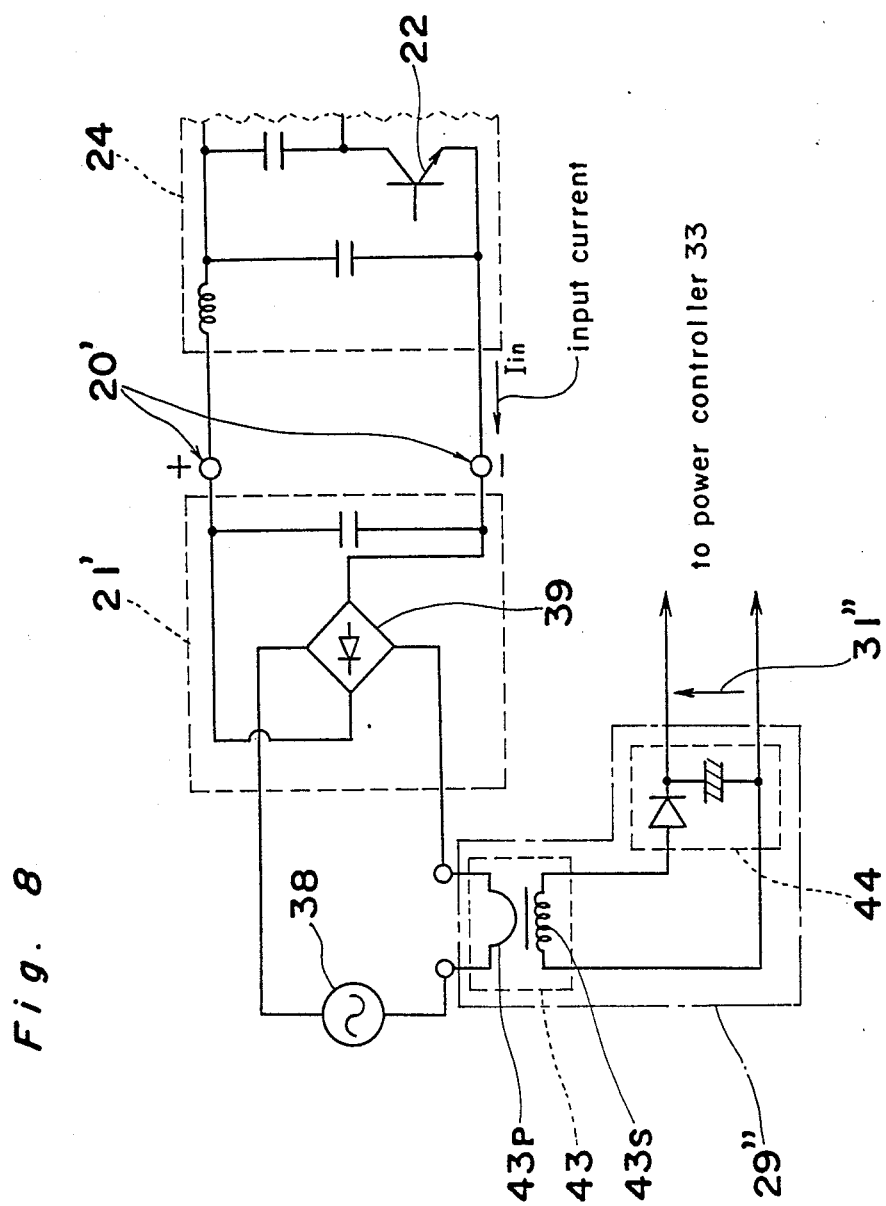
FIG. 8 is a block diagram of a second embodiment of an input current detector of the present invention.

FIG. 8 is a construction diagram showing the second embodiment of an input current detector 29". Referring to FIG. 8, the primary winding $43_P$ of a current detection transformer 43 is inserted into a commercial power supply 38 and a third rectification circuit 39 to convert the voltage in the secondary winding $43_S$ into an input current 31" through a fifth rectification circuit 44 so that the information corresponding to the input current $I_{IN}$ may be outputted.

A magnetron 25, which is a feeding object of a magnetron feeding apparatus of the present invention, will be described hereinafter.

Figure 9:
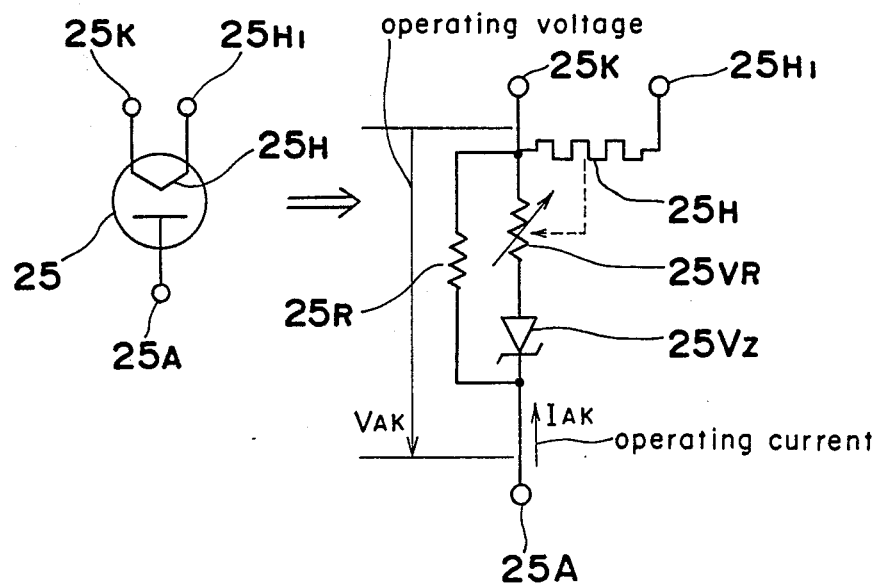
FIG. 9 shows a simple equivalent circuit of a magnetron.

FIG. 9 shows a single equivalent circuit of a magnetron 25. As shown in FIG. 9, an equivalence between the anode $25_A$ and the cathode $25_K$ may be obtained by a resistor 25R, a variable resistor $25V_R$ and a Zener diode $25V_Z$. Also, the value of the variable resistor $25V_R$ is changed through the heating operation of a heater $25_H$. ($V_R$ value during non-heating of the heater $25_H$)/($V_R$ value during heating of the heater $25_H$) becomes a value of 100 or more, so that the magnetron 25 oscillates at a high frequency during the heating operation of the heater $25_H$.

Figure 10:
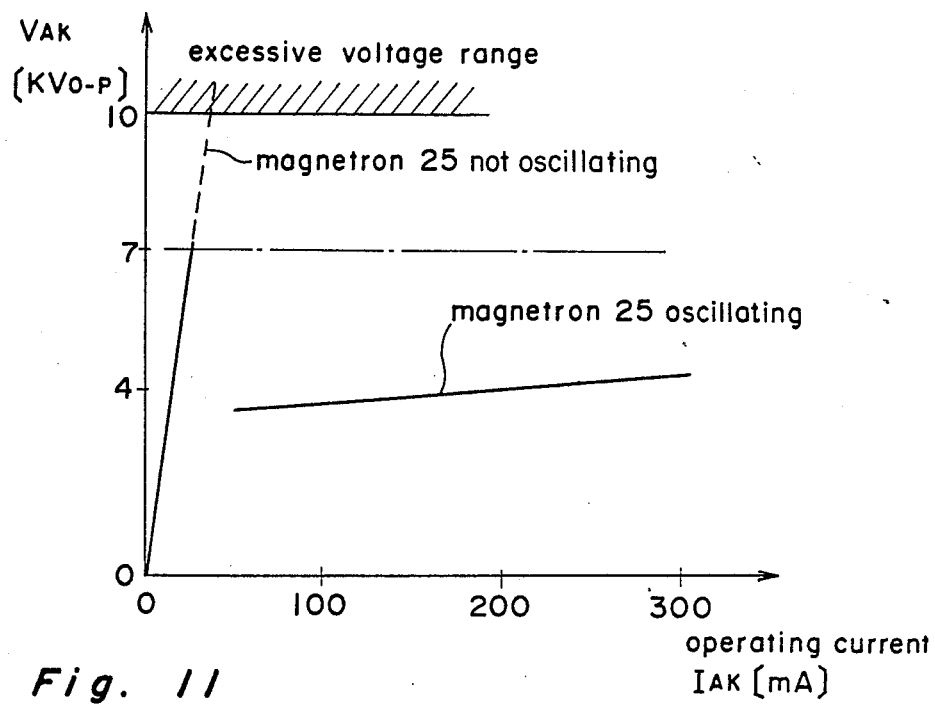
FIG. 10 shows a characteristic graph of a magnetron.

Accordingly, the relationship between the operating voltage: $V_{AK}$ to be applied between the anode $25_A$ of the magnetron 25 and the cathode $25_K$, and the operating current: $I_{AK}$ becomes a load equivalent to the resistance of the high impedance when the magnetron 25 is not oscillating, and a load equivalent to a Zener diode of a low impedance when the magnetron 25 is oscillating as shown in the characteristic graph of FIG. 10.

Application of the voltage of $V_{AK} \geqq 10_{KVo\text{-}p}$ deteriorates the insulation within the magnetron 25, causes discharges to considerably reduce the life service.

Figure 11:
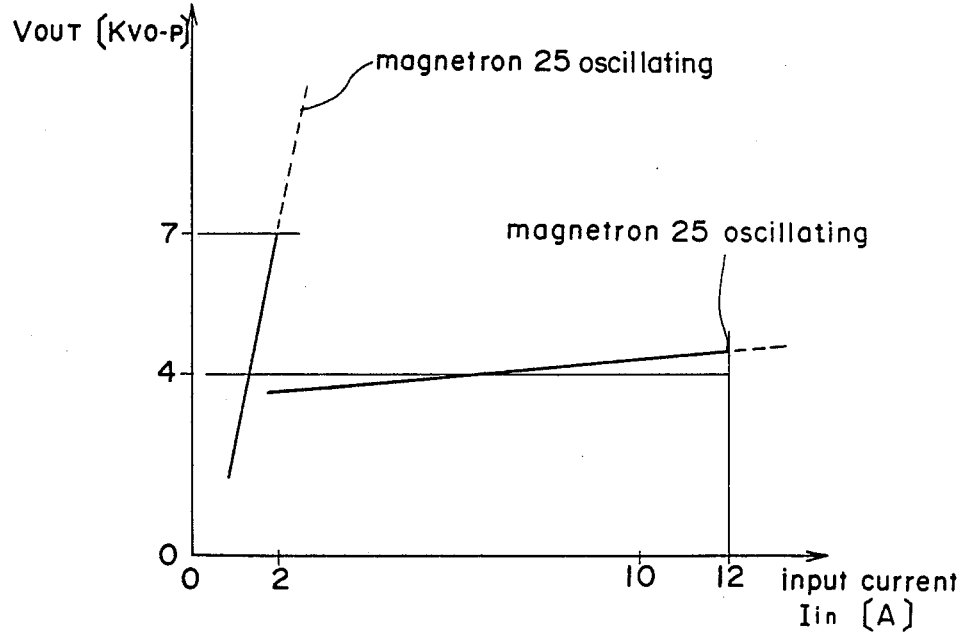
FIG. 11 shows a characteristic graph of a magnetron feeding apparatus.

FIG. 11 is an input, output characteristic graph of the magnetron feeding apparatus showing the relationship between the input current: $I_{IN}$ of an inverter circuit which feeds power to such a magnetron 25 and the output voltage $V_{OUT}$ of the high-tension transformer.

In FIG. 11, when the magnetron 25 is not oscillating, the high impedance load through $V_{OUT} = 7_{KVo\text{-}p}$ is driven in $I_{IN} = 2_A$. When the magnetron 25 is oscillating, the low impedance load is driven under constant voltage which is hardly changed within $V_{OUT}$ being $4_{KVo\text{-}p}$ in $I_{IN} = 2_A$ through $12_A$.

Figure 12:
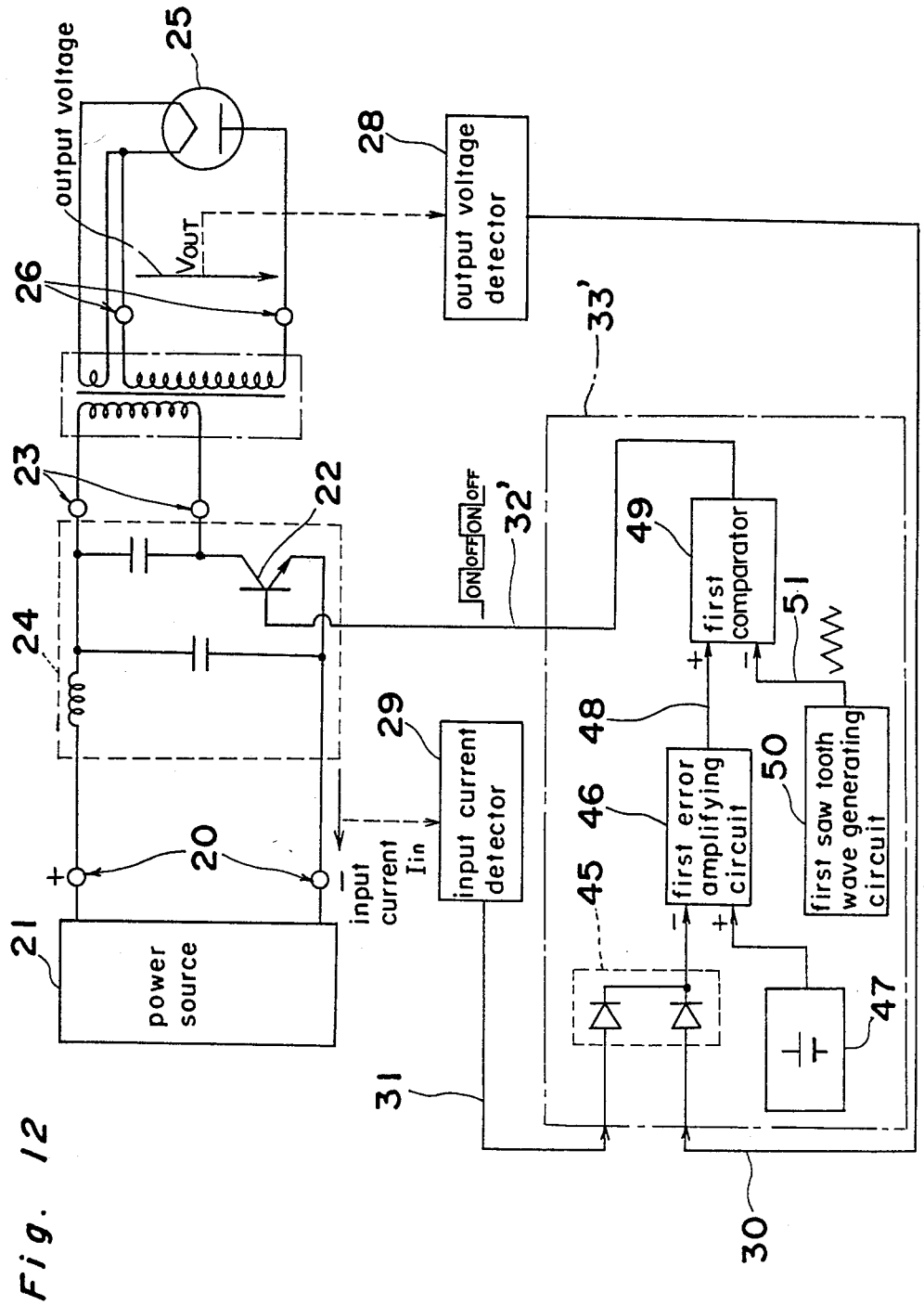
FIG. 12 is a block diagram of a first embodiment of a power controller of the present invention.

FIG. 12 is a block diagram showing the first embodiment of a power controller 33'. Referring to FIG. 12, a first diode circuit 45 inputs the larger of the output voltage 30 and the input current 31 into a first error amplification circuit 46.

The first error amplification circuit 46 outputs a difference signal 48 between this input and the output of a first reference signal generating circuit 47. A first comparator 49 outputs a driving pulse 32' which turns the semiconductor switch 22 on and off in accordance with the difference signal 48 and a saw-tooth wave 51 from a first saw-tooth wave generating circuit 50.

Also, the constant of each portion is set so that the input voltage 30 in the output voltage: $V_{OUT} = 7_{KVo\text{-}p}$ may conform to the output of the first reference signal generating circuit 47, and the input current 31 in the input current: $L_{IN} = 12_A$ may conform to the output of the first reference signal generating circuit 47.

In a period before the magnetron 25 starts its oscillation by such a construction as described hereinabove, the condition of the input current $L_{IN} = 2_A$ is established with respect to the output voltage $V_{OUT} = 7_{KVo\text{-}p}$. The output voltage 30 increases with decreases in the output of the first error amplification circuit 46, so that the on time of the driving pulse 32' decreases to lower the output voltage $V_{OUT}$. Inversely, when the output voltage 30 decreases, the on time of the driving pulse 32' increases to make the output voltage $V_{OUT}$ increase.

Also, in a condition where the magnetron 25 is oscillating, the condition of the output voltage $V_{AK} = 4_{KVo\text{-}p}$ is established with respect to the input current $L_{IN} = 12_A$. With increase in the input current 31, the output in the first error amplification circuit 46 is reduced to decrease the on time of the driving pulse 32', so that the operation is effected in such a direction as to reduce the input current $I_{IN}$. Inversely, when the input current 31 is reduced, the on time of the driving pulse 32' is increased, so that the operation is effected in such a way as to increase the input current $I_{IN}$.

Figure 13:
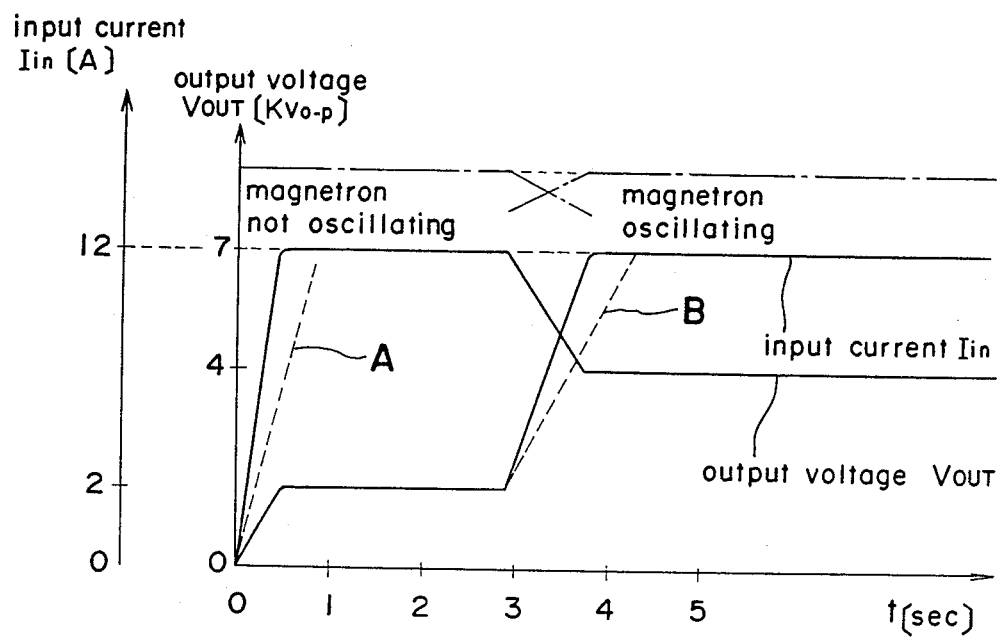
FIG. 13 shows a start characteristic graph of a magnetron feeding apparatus.

FIG. 13 is a starting characteristic graph of a magnetron feeding apparatus in such a controlled condition as described, wherein the output voltage $V_{OUT}$ is controlled to $7_{KV}$ or lower and the input current $I_{IN}$ is controlled to $12_A$. Also, upon oscillation of the magnetron 25, the starting is immediately effected up to the steady state of the input current $I_{IN} = 12_A$ without the consumption of the time.

Figure 14:
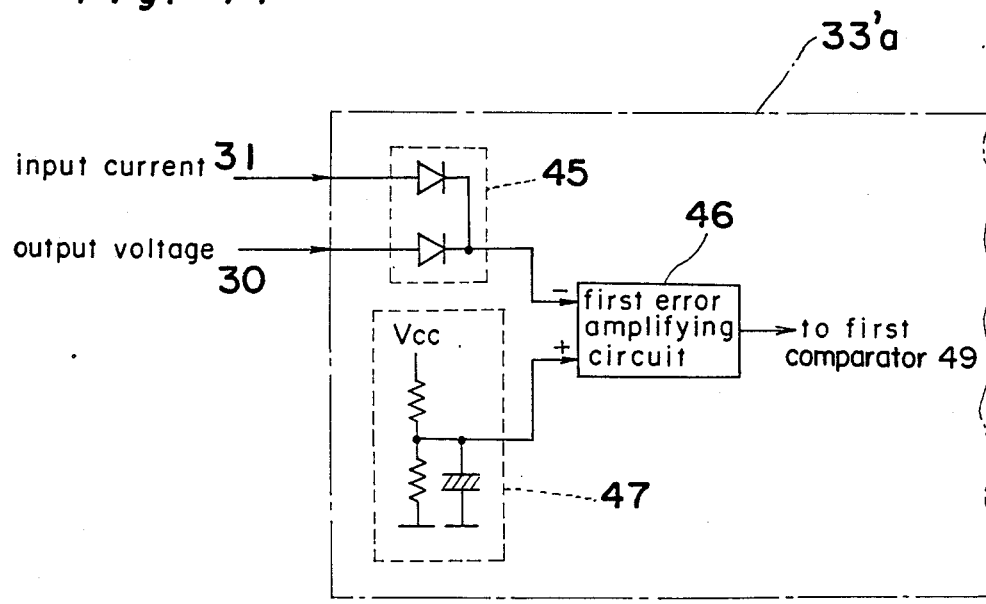
FIG. 14 is a block diagram of another embodiment of a first reference signal generating circuit of the present invention.

Also, in FIG. 12, such time constant as shown in FIG. 14 is used for the first reference signal generating circuit 47, with the output voltage $V_{OUT}$ may be gradually increased up to $7_{KV}$ as shown in the dotted line A of FIG. 13.

Figure 15:
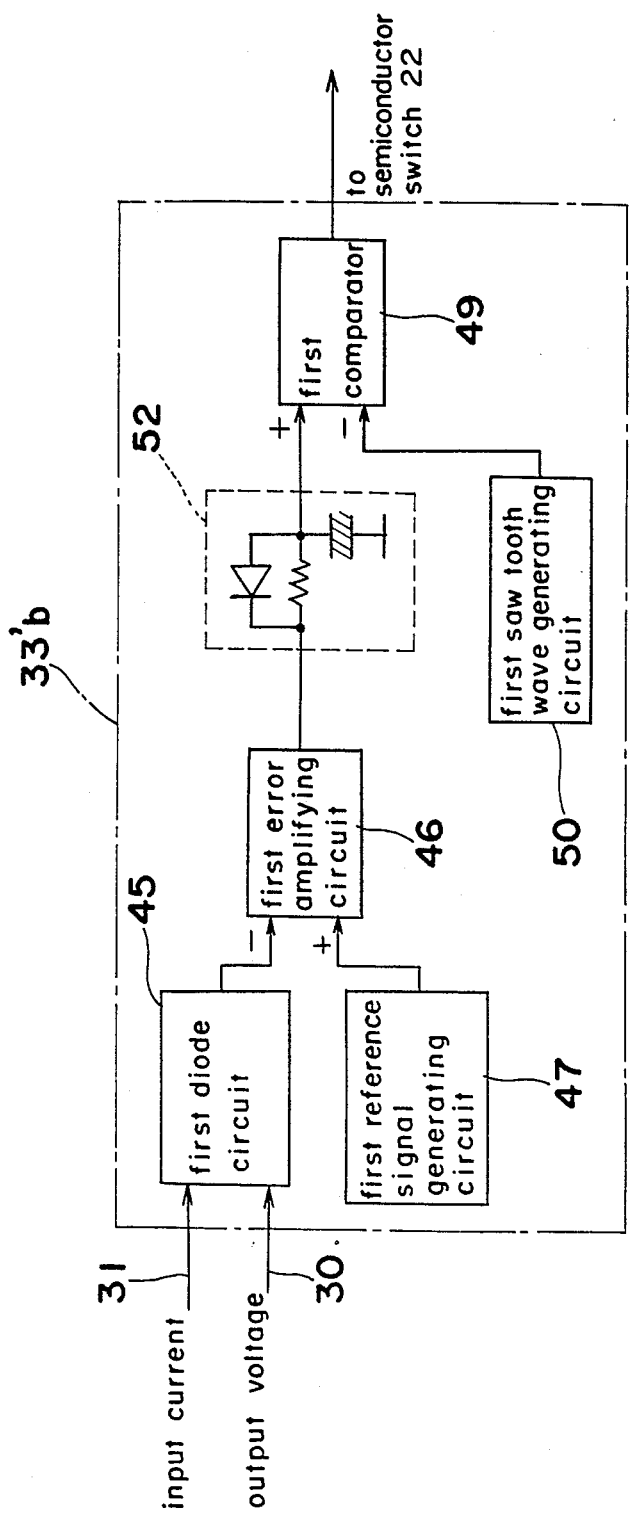
FIG. 15 is a block diagram of a first gradual increasing circuit.

Also, in FIG. 12, insert such a first gradual increasing circuit 52 as shown in FIG. 15 into between a first error amplification circuit 46 and a first comparator 49, the output voltage $V_{OUT}$ and the input current $I_{IN}$ may be gradually increased as shown in the dotted line A and the dotted line B of FIG. 13.

Figure 16:
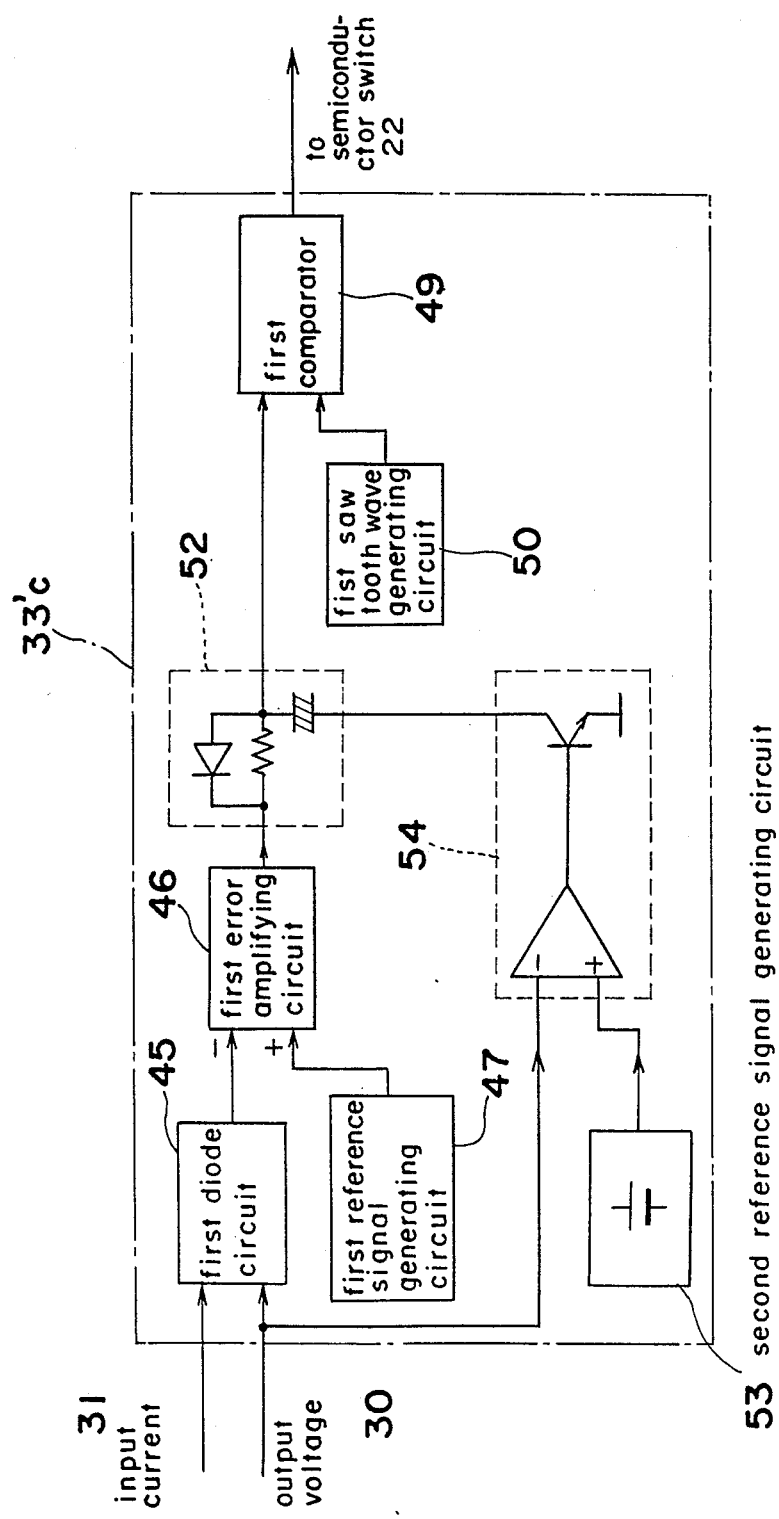
FIG. 16 is a block diagram of another embodiment of a power controller of the present invention which is partially changed from the controller shown in FIG. 13.
Figure 17:
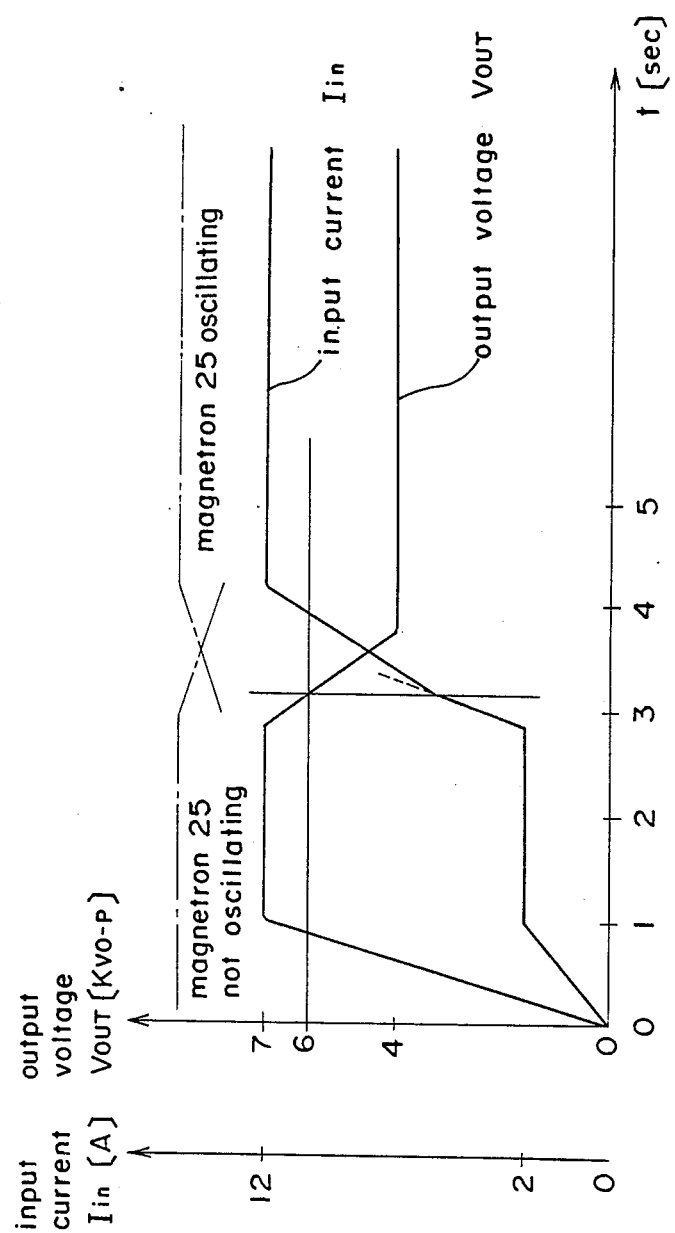
FIG. 17 is a characteristic graph thereof.

As shown in FIG. 16, by the use of the first gradual increasing circuit 52, a second reference signal generating circuit 53 is provided which is equivalent to, for example $6_{KVo\text{-}p}$ if the output voltage $V_{OUT}$ is $6_{KVo\text{-}p}$ or more, and which is turned on when the output voltage $V_{OUT}$ is $6_{KVo\text{-}p}$ or lower, so that the input current $I_{IN}$ may be gradually increased if the output voltage $V_{OUT} < 6_{KVo\text{-}p}$ as shown in FIG. 17.

Figure 18:
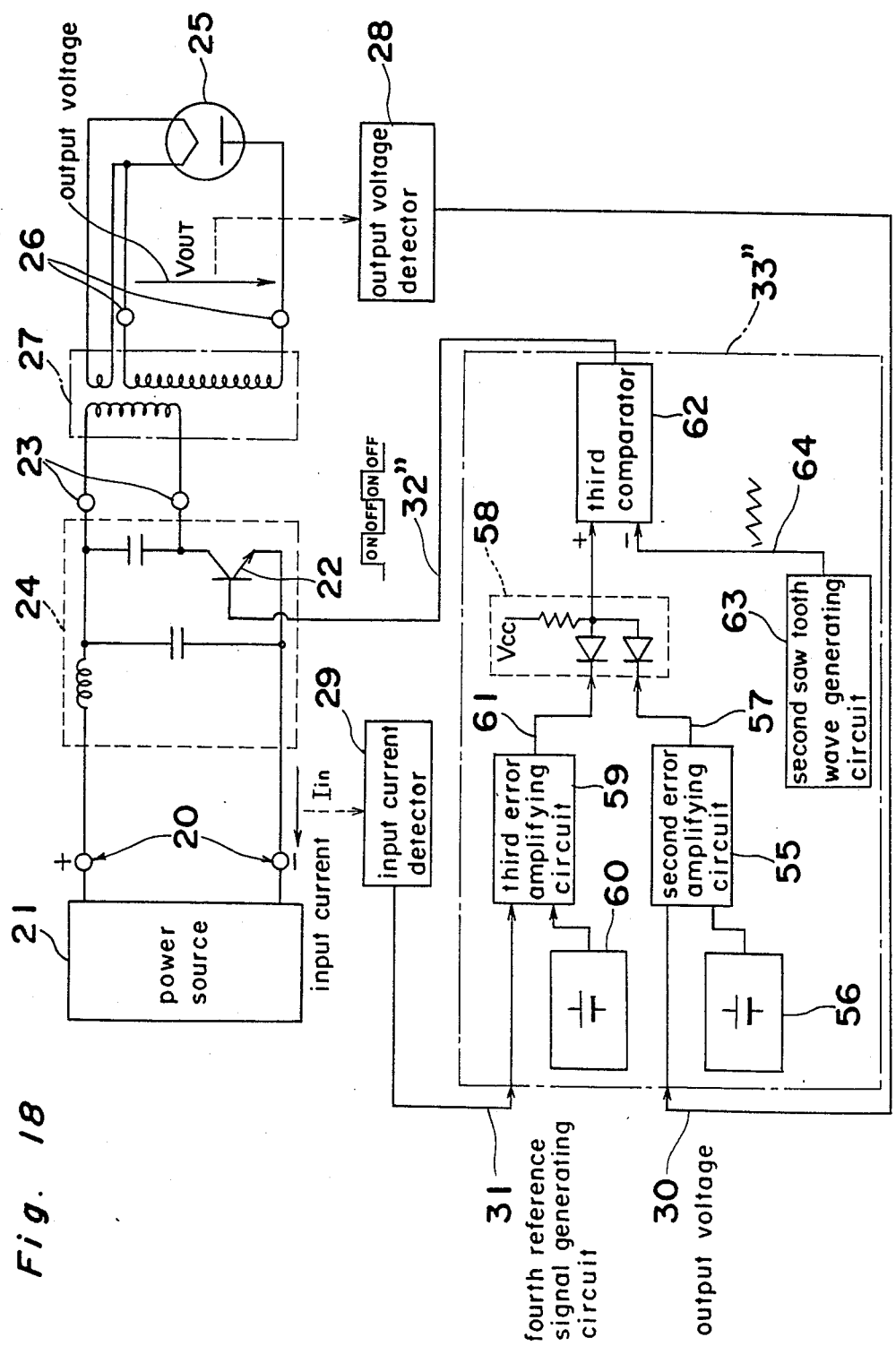
FIG. 18 is a block diagram of a second embodiment of a power controller of the present invention.

FIG. 18 is a block diagram showing a second embodiment of a power controller 33''.

A second error amplification circuit 55 outputs a difference signal 57 between the output voltage 30 and the reference signal of a third reference signal generating circuit 56 to a second diode circuit 58.

Similarly, a third error amplification circuit 59 outputs a difference signal 61 between the input current 31 and the reference signal of a fourth reference signal generating circuit 60 to a second diode circuit 58. The second diode 58 outputs to a third comparator 62 the smaller of the two difference signals 57 and 61. The third comparator 62 outputs a driving pulse 32'' which turns the semiconductor switch 22 on and off by the input and the sawtooth wave 64 from the second saw-tooth wave generating circuit 63.

Also, the constant of each portion is set so that the output voltage 30 in the output voltage $V_{OUT} = 7_{KVo\text{-}p}$ may confirm to the output of a third reference signal generating circuit 56, and the input current 31 in the input current $I_{IN} = 12_A$ conforms to the output of a fourth reference signal generating circuit 60.

In such a period before the magnetron 25 starts its oscillation by such a construction as described hereinabove, the required input current $I_{IN}$ when the output voltage $V_{OUT}$ is $7_{KVo\text{-}p}$ as shown in FIG. 11 is approximately $2_A$, so that the difference signal 61 from the third error amplification circuit 59 becomes larger than the difference signal 57 from the second error amplification circuit 55.

Accordingly, in this period, the required input current $I_{IN}$ is less, i.e., the difference signal 57 from the second error amplification circuit 55 is selectively outputted by a second diode circuit 58. Thus, with increase in the output voltage 30, the output of the second error amplification circuit 55 is decreased to reduce the on time of the driving pulse 32'', so that the operation is effected in such a direction as to decrease the output voltage $V_{OUT}$. Inversely, when the output voltage 30 is reduced, the on time of the driving pulse 32'' increases so that the operation is operated in such a direction as to increase the output voltage $V_{OUT}$.

Also, in a condition where the magnetron 25 is oscillating, the output voltage $V_{OUT}$ when the input current $I_{IN}$ is approximately $4_{KVo\text{-}p}$ as shown in FIG. 11, so that the difference signal 57 from the second error amplification circuit 55 becomes larger than the difference signal 61 from the third error amplification circuit 59.

Accordingly, in this period, the required input current $I_{IN}$ is small, i.e., the difference signal from the third error amplification circuit 59 is selectively outputted by the diode circuit 58. Thus, with an increase in the input current 31, the output of the third error amplification 59 decreases to reduce the on time of the driving pulse 32'', so that the operation is effected in such a direction as to reduce the input current $I_{IN}$. Inversely, when the input current 31 decreases, the operation is effected in such a way as to increase to make the input current $I_{IN}$ more through the increase of the on time of the driving pulse 32''.

Even in the second embodiment, the starting characteristics becomes the same as those of the starting characteristics graph of the first embodiment shown in FIG. 13.

Also, the third reference signal generating circuit 56 is constructed to have the time constant of the above-described FIG. 14, so that the controlling operation may be performed so as to gradually increase the output voltage $V_{OUT}$ up to $7_{KV}$ as shown in the dotted line A of FIG. 13.

Similarly, the first gradual increasing circuit 52 shown in FIG. 15 is inserted into between the second diode circuit 58 and the third comparator 62, so that the controlling operation may be controlled so as to gradually increase the output voltage $V_{OUT}$ and the input current $I_{IN}$ as in the dotted line A of FIG. 13 and the dotted line thereof.

In addition, the first gradual increasing circuit 52 is inserted into between the second diode circuit 58 and the third comparator 62. The first gradual increasing circuit 52 is turned on and off in accordance with the output voltage 30 as shown in FIG. 16 to gradually increase the input current $I_{IN}$.

Figure 19:
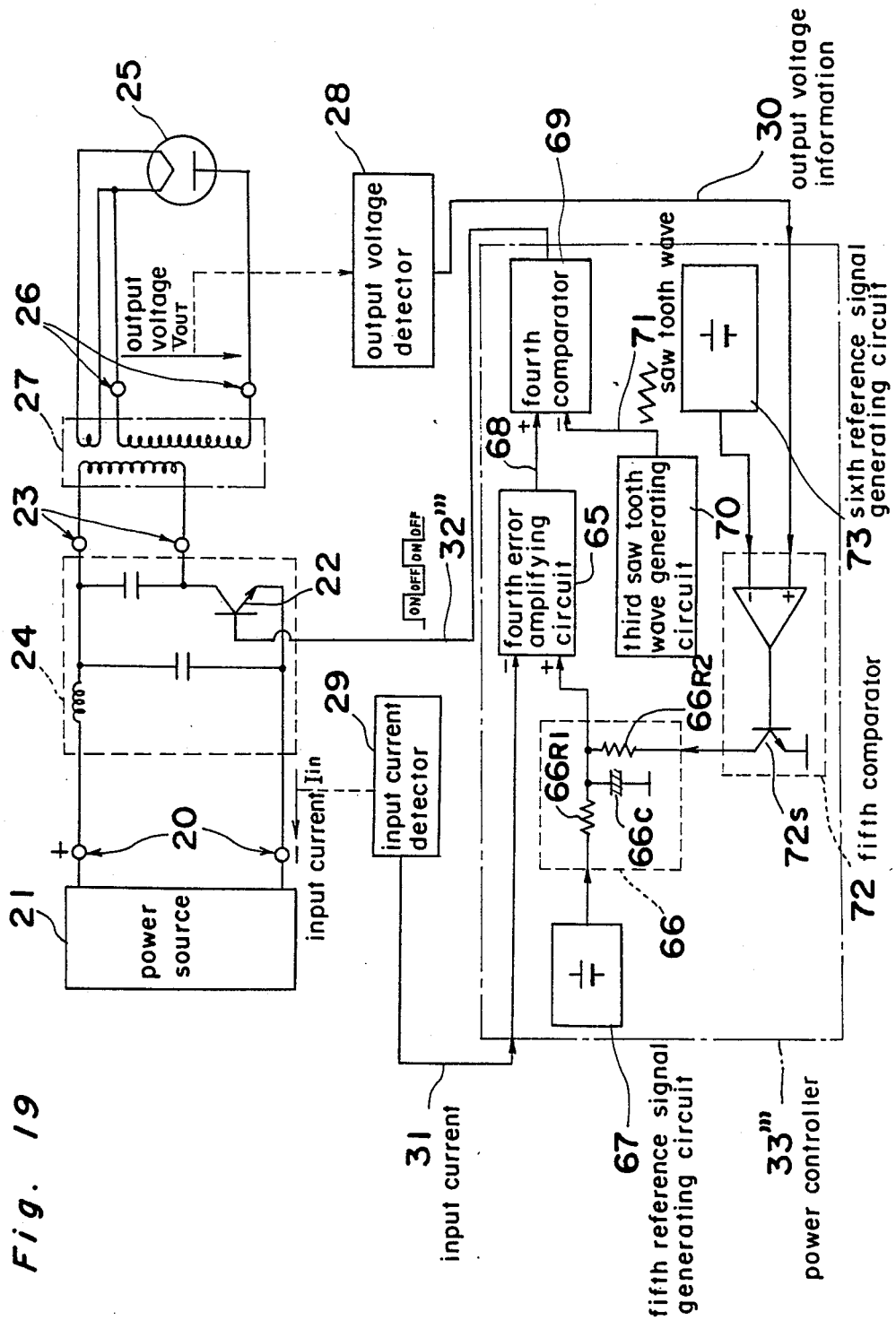
FIG. 19 is a block diagram of a third embodiment of a power controller of the present invention.

FIG. 19 is a block diagram showing a third embodiment of the power controller portion 33'''. Referring to FIG. 19, a fourth error amplification circuit 65 outputs to a fourth comparator 69 a difference signal 68 between the reference signal from a fifth reference signal generating circuit 67 passing through the gradual increasing, gradual decreasing circuit 66, and the input current 31. The fourth comparator 69 outputs a driving pulse 32'' which switches the semiconductor switch 22 on and off through the difference signal 68 and the sawtooth wave 71 from the third sawtooth wave generating circuit 70.

Also, the constant of each portion is set so that the input current 31 in the input current $I_{IN}=12_A$ may conform to the output of a fifth reference signal generating circuit 67.

Also, the fifth comparator 72 compares the output voltage 30 with the output from a sixth reference signal generating circuit 73 corresponding to the output voltage 30 in the output voltage $V_{OUT}=7_{KVo-p}$ to turn off the switch 72s when the output voltage $V_{OUT}$ is smaller than 7KVo-p so as to charge the capacitor 66c through a resistor $66_{R1}$ up to the output value of the fifth reference signal generating circuit 67. Also, when the output voltage $V_{OUT}$ becomes larger than $7_{KVo-p}$, the switch 72s is turned on to discharge the capacitor 66c through a resistor 66Rz by a short time constant with respect to the changing.

When the output voltage $V_{OUT}$ becomes larger than $7_{Kvo-p}$ through the above-described construction in a period before the magnetron 25 starts its oscillation, the normal input of the fourth error gradual increasing circuit 65 is decreased, and the output of the difference signal 68 from the fourth error amplifying circuit 65 is decreased to reduce the on time of the driving pulse 32'', so that the input current $I_{IN}$ decreases to lower the output voltage $V_{OUT}$.

Inversely, when the output voltage $V_{OUT}$ becomes smaller then $7_{KVo-p}$, the on time of the driving pulse 32'' is increased, so that the operation is effected in a direction of increasing the output voltage $V_{OUT}$.

Also, in a condition where the magnetron 25 is oscillating, the output voltage $V_{OUT}$ is approximately $4_{KVo-p}$, with the switch 72s being off.

Accordingly, the input current 31 increases, the output of the fourth error amplification circuit 65 is decreased to reduce the on time of the driving pulse 32'' so that the operation is effected in such a direction as to reduce the input current $I_{IN}$. Inversely, when the input current 31 is decreased, the on time of the driving pulse 32'' is decreased so that an operation is effected in such a way as to increase the input current $I_{IN}$.

Figure 20:
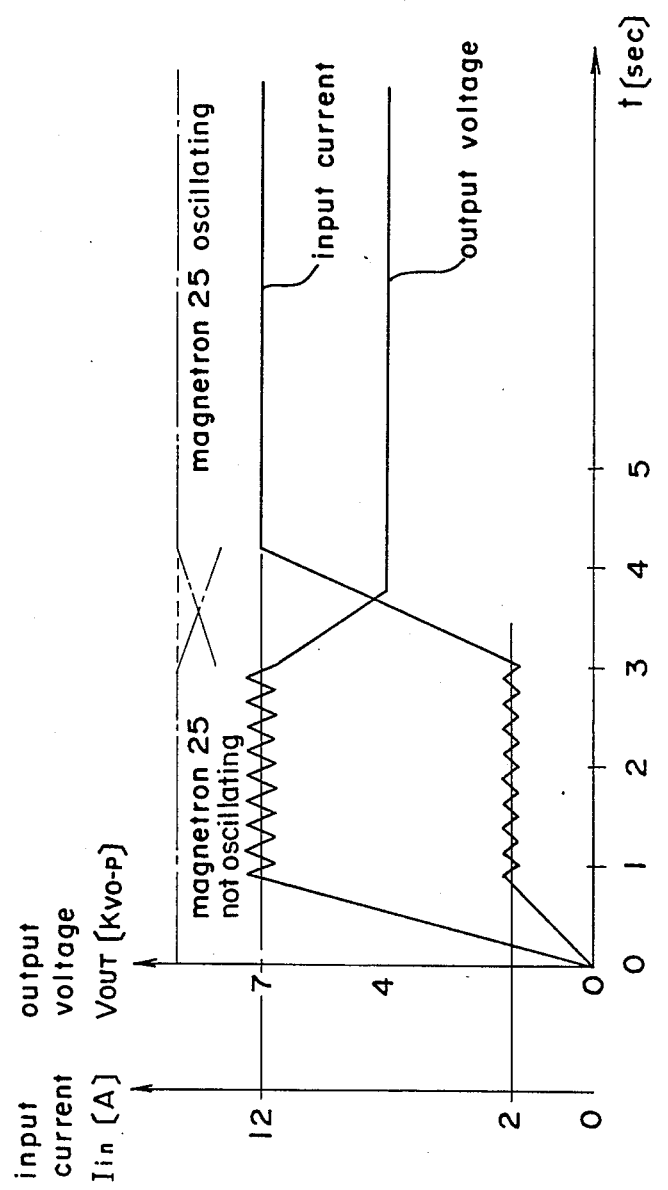
FIG. 20 is a characteristic graph of a magnetron feeding apparatus in this case.

FIG. 20 is a characteristic graph of a magnetron feeding apparatus in such a condition as described hereinabove.

As shown in FIG. 20, in a period before the magnetron 25 starts it oscillation, the output voltage $V_{OUT}$ increases up to $7_{KVo-p}$, thereafter minutely vibrates around $7_{KVo-p}$ and the input current $I_{IN}$ increases up to $12_A$ and then is controlled so as to be constant.

Figure 21:
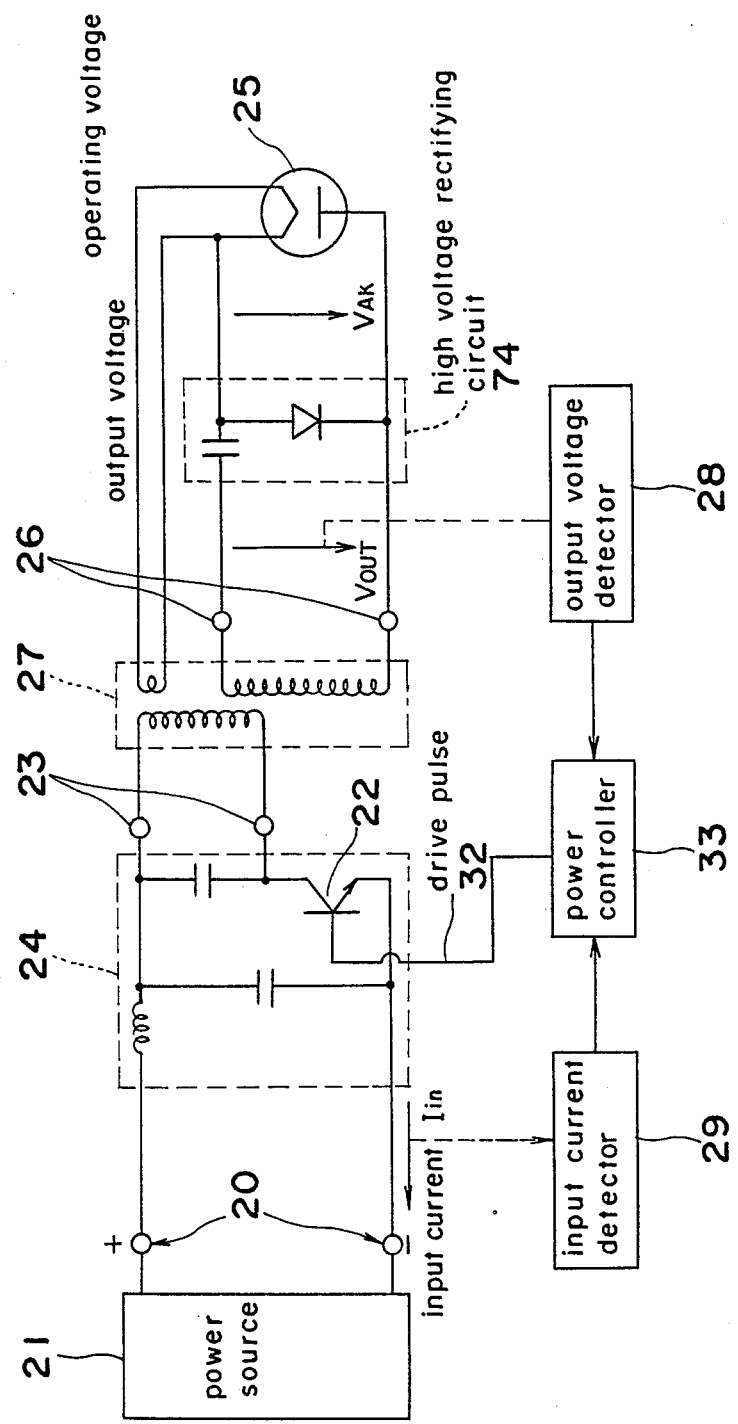
FIG. 21 is the other construction conventional diagram of a magnetron feeding apparatus.

FIG. 21 is a construction conceptional diagram of a magnetron feeding apparatus when a high-tension rectification circuit 74 is inserted into between the high-tension transformer 27 and the magnetron 25.

Referring to FIG. 21, the sensitivity of the output voltage detector 28 is required to be approximately doubled as the output voltage $V_{OUT}$ is different in value from the operatively voltage $V_{AK}$. Accordingly, the power controller 33 may be realized in terms of the operation similar to the above-described operation even in a magnetron feeding apparatus equipped with a high-tension rectification circuit 74.

Figure 22:
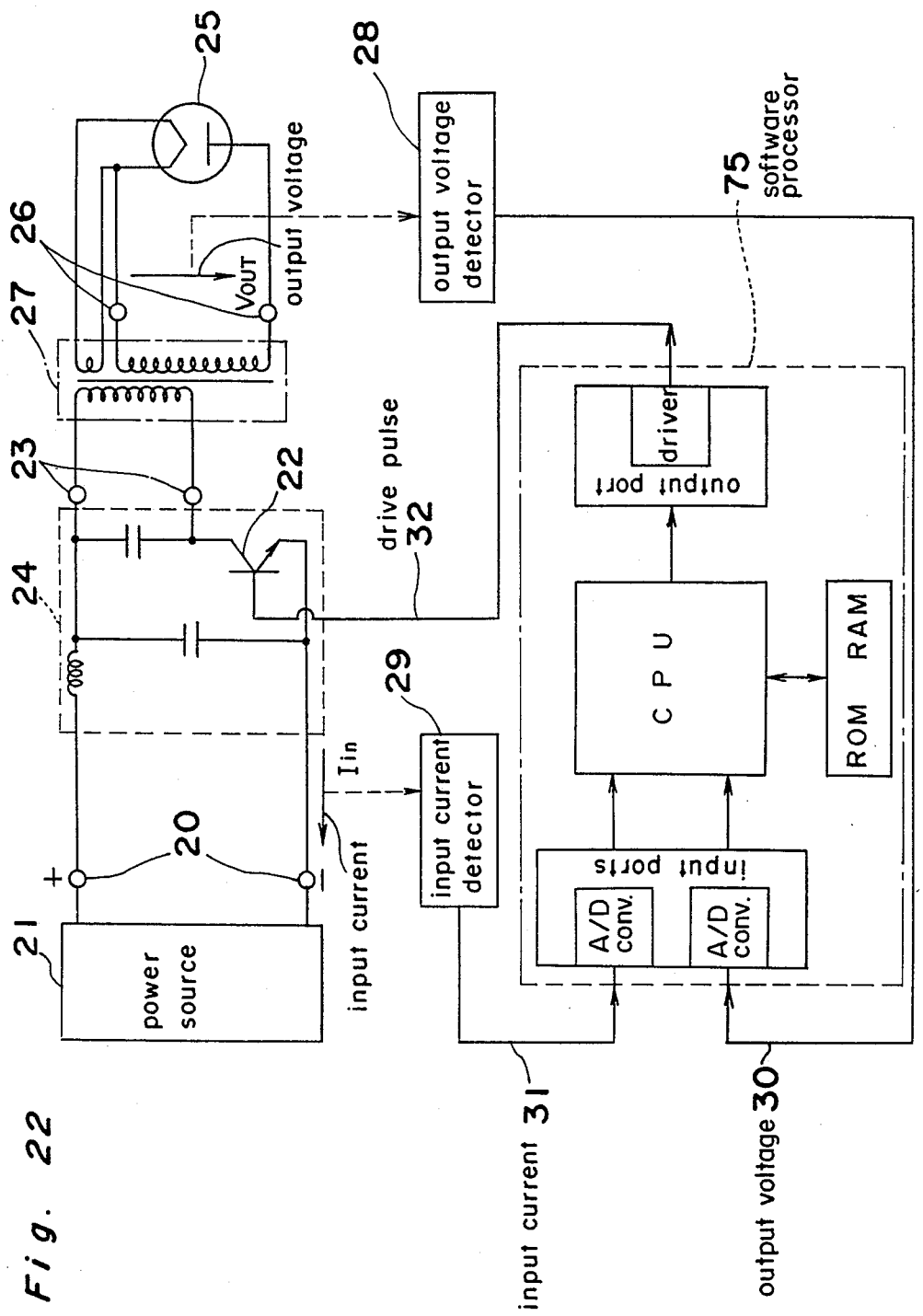
FIG. 22 is a circuit block diagram of a magnetron feeding apparatus when the power controlling operation is performed by the software processing operation.

FIG. 22 is a circuit block diagram in a case where the power control of the magnetron feeding apparatus is effected by the software processing.

Referring to FIG. 22, the software processing portion 75 inputs the input current 31 from the input current detector 29 and the output voltage 30 from the output voltage detector 28 to change the on time or the like of the driving pulse 32 which turns the semiconductor switch 22 on and off in accordance with the two valve 30 and 31 to perform the power control of the magnetron feeding apparatus.

An A/D converter, which is adapted to convert the input current 31 and the output voltage 30 into digital signals convenient for software processing, is used for the software processor 75, with the converting operation being omitted in the present application.

Figure 23:
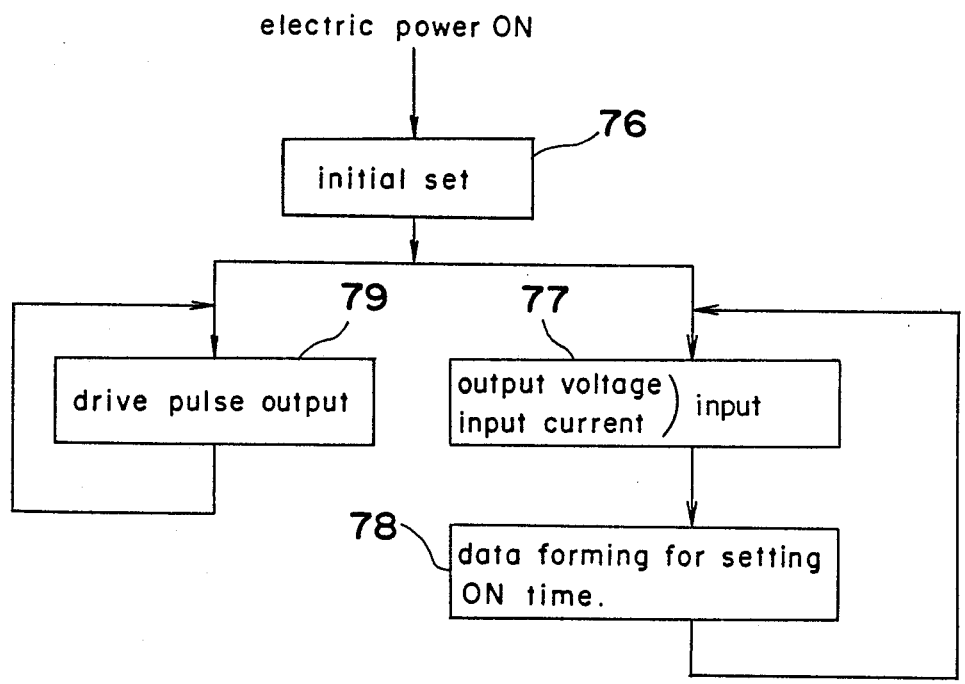
FIG. 23 is a conceptional diagram of a program flow of a software processing portion.

FIG. 23 is a conceptional diagram of a program flow of the software processor 75. Referring to FIG. 23, the power supply is turned on to perform the initial setting 76 for inner data or the like, thereafter to repeat the inputting operation 77 of the output voltage 30 and the input current 31, the production of the data for setting the on time to set the on time of the semiconductor switch by the use of this information for the outputting operation 79 of the driving pulse 32 for turning the semiconductor switch 22 on and off by the use of the data for setting the on time.

Figure 24:
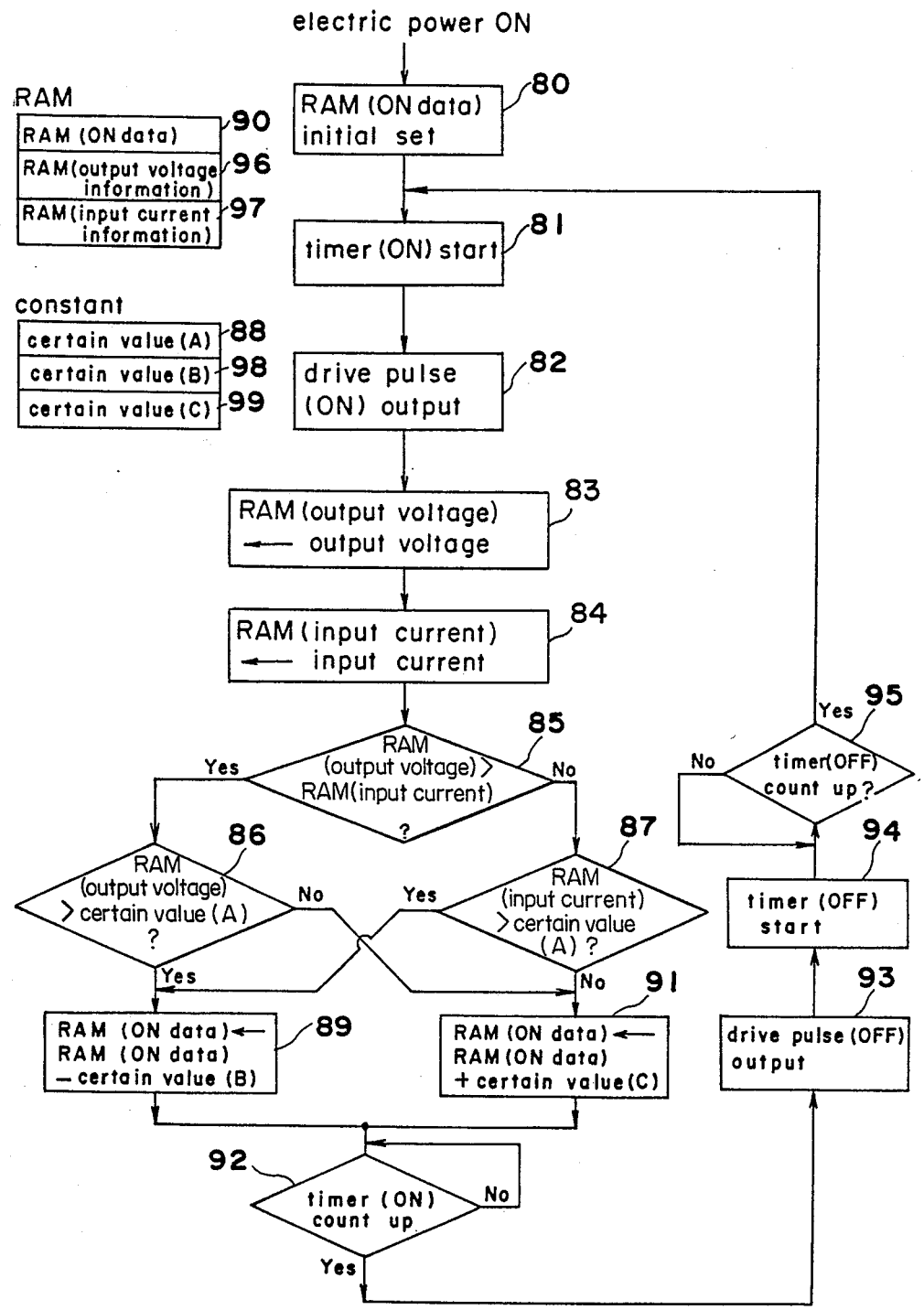
FIG. 24 is a flowchart of a first embodiment of a software processing portion of the present invention.

FIG. 24 is a flowchart showing the first embodiment of the software processor 75. Referring to FIG. 24, the RAM (on data) initial setting 80 is effected, to shorten the initial on time of the semiconductor switch 22, when the power supply is turned on. Then, the timer (on) start 81 for setting the on time of the semiconductor switch 22 is effected in accordance with the value of the RAM (on data) 90, so that the output 82 of the driving pulse (on) which turns on the semiconductor switch 22 is effected.

RAM (output voltage information) for inputting the output voltage 30←the output voltage information 83 and RAM (input current information for inputting the input current 31←the input current 84 are perfomed. The two values all compared in RAM (output voltage)>RAM (input current) 85. The larger information is compared with the given value (A) 88 in RAM (output voltage)>given value (A) 86 or RAM (input current)>given value (A) 87. When the value is larger than the given value AA) 88, the RAM (on data) 90 is decreased by the RAM (on data)—given value (B) 89. When it is smaller than the given value (A) 88, the RAM (on data) 90 is increased by the RAM (on data)+-given value (C) 91. Then, when the timer (on) completion 92 and the driving pulse (off) output 93 are performed to release the on condition of the semiconductor switch 22.

Then, after the off time of the semiconductor switch 22 has been controlled by the timer (off) start 94 and the timer (off) completion 95 to return to the timer (on) start 81.

By the processing as described hereinabove, the output voltage 30 is larger than the input current 31 in a period before the magnetron 25 starts its oscillation. When the RAM (output voltage) 96 is larger than the given value (A) 88, the RAM (on data) 90 is decreased to make the on time of the semiconductor switch 22 shorter to reduce the output voltage $V_{OUT}$. Inversely, when the RAM (output voltage) 96 is smaller than the given value (A) 88, the RAM (on data) 90 is increased to make the output voltage $V_{OUT}$ more.

After the magnetron 25 starts its oscillation, the input current 31 becomes larger than the output voltage 30. The RAM (input current) 87 is compared with the given value (A) 88 to increase or decrease the RAM (on data) 90 in accordance with the result so that an operation is effected so as to control the input current $I_{IN}$.

The large value of the output voltage 30 and the input current 31 is controlled to conform to the given value (A) 88. Also, the value size of the given value (B) 98 and the given value (C) 99 may vary the change speed of the increase, decrease of the output voltage $V_{OUT}$, the input current $I_{IN}$.

Figure 25:
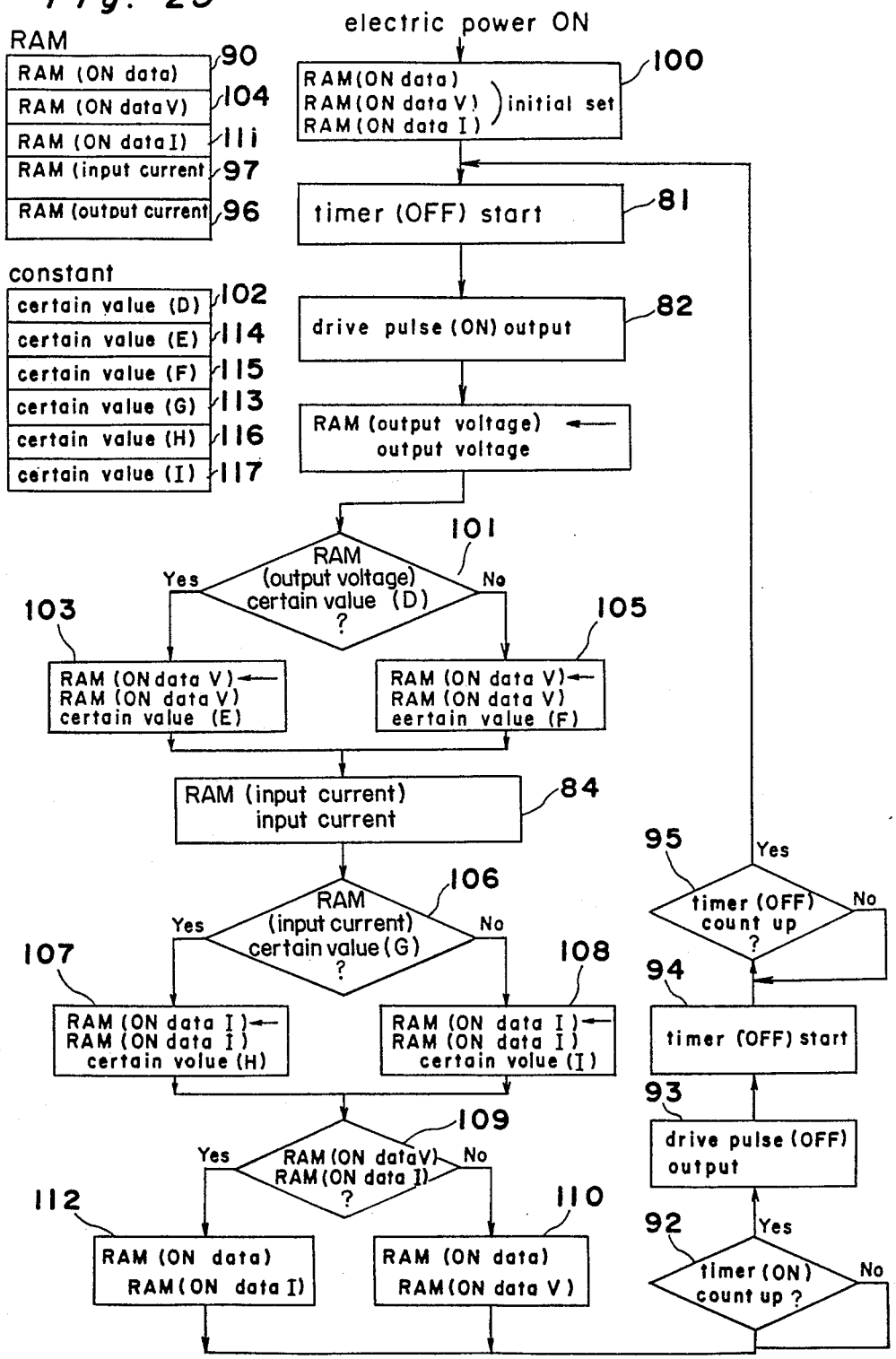
FIG. 25 is a flowchart of a second embodiment of a software processing portion of the present invention.

FIG. 25 is a flowchart showing the second embodiment of the software processing portion 75. Referring to FIG. 25, when the power supply is turned on, the initial setting 100 of the RAM (on data), RAM (on data V), RAM (on data I) is performed so as to shorten the initial on time of the semiconductor switch 22. Then, the timer (on) start 81 is effected to set the on time of the semiconductor switch 22 in accordance with the value of the RAM (on data) 90, so that the (on) output 82 of the driving pulse (on) which turns on the semiconductor switch 22 is effected.

The RAM (output voltage) for inputting the output voltage 30←the output voltage 83 is effected. The value is compared in RAM (output voltage)>given value (D) 101. When it is larger than the given value (D) 102, the RAM (on data V) 104 is reduced in RAM (on data V)—given value (E) 103. When it is smaller than the given value (D) 102, the RAM (on data V) 104 is increased in RAM (on data V)+given value (F) 105.

Then, similarly, RAM (input current)←input current 84, RAM (input current) >given value (G) 106, and RAM (on data I)—given value (H) 107 or RAM (on data I)+given value (1) 108 are effected.

Then, a comparing operation is performed in RAM (on data V)>RAM (on data I) 109. When RAM (on data V) 104 is smaller, RAM (on data)←RAM (on data V) 110 is effected. When RAM (on data I) 111 is smaller, RAM (on data)←RAM (on data I) 112 is effected.

Then, the timer (on) completion 92 and the driving pulse (off) output 83 are effected to release the on condition of the semiconductor switch 22.

Then, the off time of the semiconductor switch 22 is controlled by the timer (off) start 94 and the timer (off) completion 95 and thereafter it returns to the timer (on) start 81.

By such processing as described, the RAM (output voltage) 96 approaches the given value (D) 102 in a period before the magnetron 25 starts its oscillation. Also, RAM (input current) 97<<given value (G) 113, thus resulting in RAM (on data V) 104<RAM (on data I) 111, with RAM (on data) 90 conforming in value to the RAM (on data V) 104.

Accordingly, in this period, when RAM (output voltage) 96 is larger than the given value (D) 102, the RAM (on data V) 104 is decreased to make the on time of the semiconductor switch 22 shorter so as to reduce the output voltage $V_{OUT}$. Inversely, when it is smaller, the RAM (on data V) 104 is increased to make the output voltage $V_{OUT}$ higher, so that the output voltage 30 is controlled to conform to the given value (D) 102.

Also, after the magnetron 25 has started its oscillation, the RAM (input current) 97 is approached to the given value 113, RAM (output voltage 96<<given value (D)) 102, thus resulting in RAM (on data V) 104>RAM (on data I) 111, with RAM (on data) 90 conforming to the RAM (on data I) 111.

Accordingly, in this period, the RAM (on data I) 111 is decreased when the RAM (input current) 97 is larger than the given value (G) 113 to make the on time of the semiconductor switch 22 shorter so as to decrease the input current $I_{IN}$. Inversely, when it is smaller, RAM (on data I) 111 is increased to increase the input current $I_{IN}$, so that the input current 31 is controlled to conform to the given value (G) 113. The processing that the value of the RAM (on data) 90 is set though the choice of the smaller of the RAM (on data V) 104 and the RAM (on data I) 111 results in the choice of the smaller one of the required input current $I_{IN}$. Also, the change speed of increase, decrease in the output voltage $V_{OUT}$ may be varied by the given value (E) and the given value (F) 115, while the change speed of increase, decrease in the input current $I_{IN}$ may be varied by the given value (H) 116 and the given value (I) 117.

Figure 26:
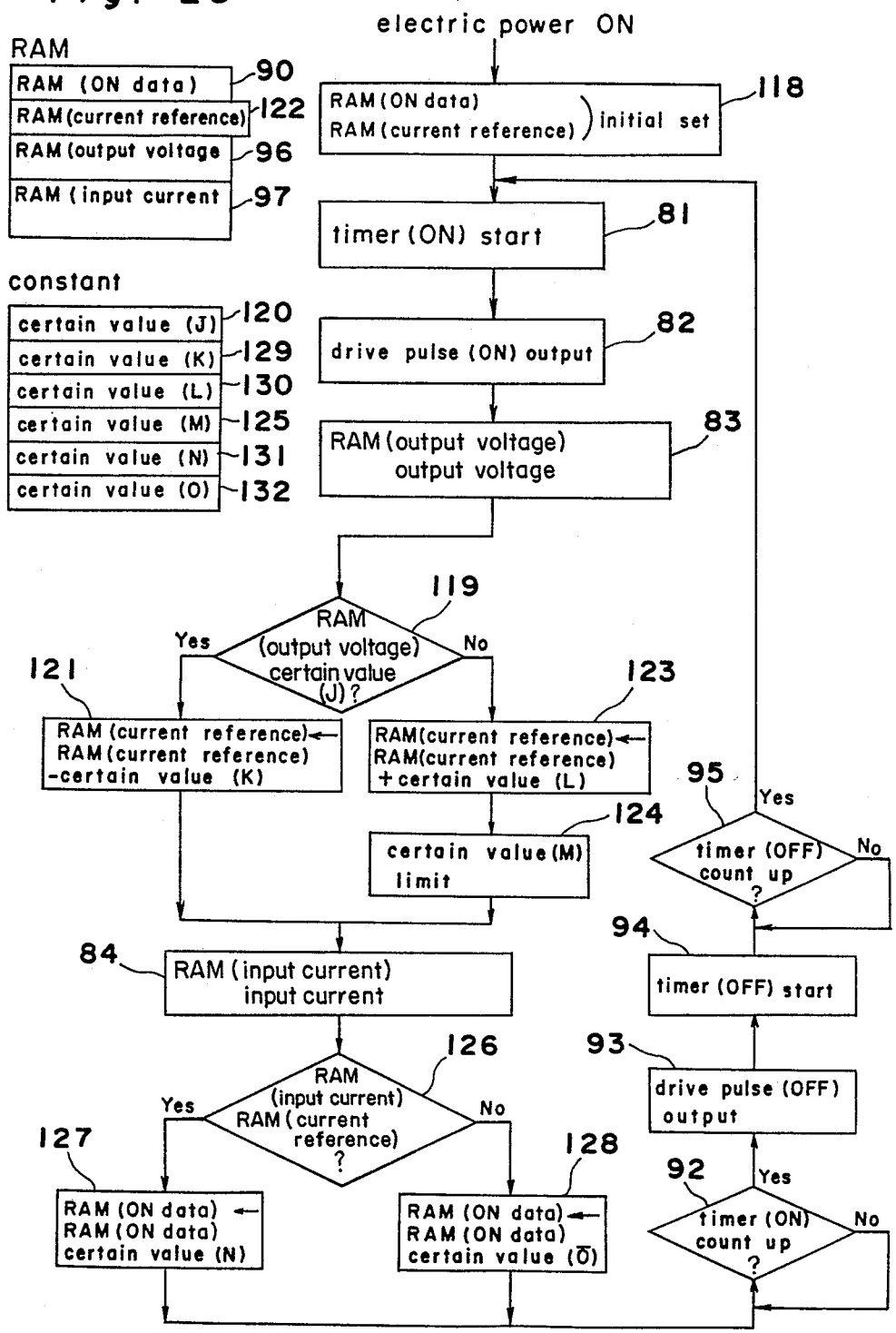
FIG. 26 is a flowchart of a third embodiment of a software processing portion of the present invention.

FIG. 26 is a flowchart showing the third embodiment of a software processing portion 75. Referring to FIG. 26, when the power supply is turned on, the initial setting 118 of the RAM (on data), RAM (current reference) is effected to shorten the first on time of the semiconductor switch 22. Then, the timer (on) start 81 is effected which sets the on time of the semiconductor switch 22 by the use of the RAM (on data) 90 to perform the outputting operation 82 of the driving pulse (on) which turns on the semiconductor switch 22.

The RAM (output voltage) for inputting the output voltage 30←the output voltage 83 is effected.

This value is compared in RAM (output voltage)>given value (J) 120, the RAM (current reference) 122 is decreased in RAM (current reference)—given value (K) 121. Inversely, when it is smaller than the given value (J) 120, the RAM (current reference) 122 is increased in (RAM current reference)+given value (L) 123. The maximum value of the RAM (current reference) 122 in this case is restricted to the given value (M) limit 124 of the RAM (current reference) 122.

Then, RAM (input current) for inputting the current 31←the input current 84 is effected.

This value is compared with the RAM (input current)>RAM (current reference) 126. When it is larger than the RAM (current reference) 122, the RAM (on data) 90 is decreased in the RAM (on data)—given value (N) 127. Inversely, when it is smaller, the RAM (on data) 90 is increased in RAM (on data)+given value (o) 128.

Then, the time (on) completion 92 and the driving pulse (off) output 93 are effected to release the on condition of the semiconductor switch 22.

Then, after the off timer of the semiconductor switch 22 has been controlled by the timer (off) start 94 and the timer (off) completion 95, it is returned to the timer (on) start 81.

By such processing as described hereinabove, the RAM (output voltage) 96 approaches the given value (J) 120 in a period before the magnetron 25 oscillates, with the RAM (current reference) 122 being not limited to the given value (M) 125.

When the RAM (output voltage) 96 is larger than the given value (J) 120, the RAM (current reference) 122 is reduced, with the result that RAM (on data) 90 is reduced so that the RAM (input current) 97 may follow the reduced RAM (current reference) 122. Accordingly, the on time of the semiconductor switch 22 is reduced to decrease the output voltage $V_{OUT}$ and the input current $I_{IN}$. Inversely, when the RAM (output voltage) 96 is smaller than the given value (J) 120, the RAM (on data) 90 is increased and the output voltage $V_{OUT}$ and the input current $I_{IN}$ are increased.

The RAM (output voltage) 96 is controlled to conform to the given value (J) 120 in this period.

Also, in a period after the magnetron 25 has started its oscillation, RAM (output voltage) 96 <<given value (J) 120, with RAM (current reference) 122 becoming the same in value as the given value (M) 125.

Accordingly, when the RAM (input current) 97 is larger than the given value (M) 125, the RAM (on data) 90 is reduced to shorten the on time of the semiconductor switch 22 to reduce the input current Iin. Inversely, when it is smaller, the RAM (on data) 90 is increased to make the input current Iin more, so that RAM (input current) 97 is controlled to conform to the given value (M) 125.

Also, the change speed of the increase, decease of the output voltage $V_{OUT}$ may be respectively varied by the given value (K) 129, the given value (L) 130, the given value (1V) 131, and the given value (e,ovs/o/ ) 132. Also, the change speed of the increase, decrease of the input current $I_{IN}$ is respectively varied by the given value (N) 131 and the given value (e,ovs/o/ ) 132.

In the magnetron feeding apparatus by the present invention, optimum voltage, power may be steadily fed in a period before the magnetron starts its oscillation, the possible oscillation condition of the magnetron may be reached in a short time without application of the excessive voltage.

Also, when the possible oscillation condition is reached, the condition automatically moves to the controlling operation may be effected without consumption of the wasteful time as far as the oscillating condition of the magnetron, and also, the oscillating condition may be steadily continued.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A magnetron feeding apparatus comprising a power-supply for feeding a DC current, an inverter circuit for converting the DC current into high-frequency power through the switching operation of a semiconductor switch, a high-tension transformer which converts the high-frequency power into high-tension power to be supplied to a magnetron, an output voltage detector for detecting the output voltage of the high-tension transformer, an input current detector for detecting the input current into the inverter circuit, and a power controlling means for controlling the switching operation of the semiconductor switch using the output voltage information of the output voltage detector and the input current information of the input current detector.

2. A magnetron feeding apparatus described in claim 1, further comprising said power controlling means for controlling so that the value of the larger of the output voltage information and input current information may become a first given value.

3. A magnetron feeding apparatus described in claim 1, wherein said power controlling means comprises an output voltage controlling means for controlling so that the output voltage information may become a second given value, an input current controlling means for controlling so that the input current information may become a third given value and a selecting means for selecting a controlling means of the smaller of the output voltage controlling means and the input current controlling means in a required input current into the inverter circuit.

4. A magnetron feeding apparatus described in claim 1, wherein said power-supply is adapted to rectify the commercial power-supply to obtain the DC power supply.

5. A magnetron feeding apparatus described in claim 1, wherein said power-supply is composed of a battery.

6. A magnetron feeding apparatus described in claim 1, wherein said input current detector is adapted to detect the input current from the power-supply portion.

7. A magnetron feeding apparatus described in claim 1, wherein said output voltage detector is adapted to detect the output voltage of an exclusive detection winding provided on the high-tension transformer.

8. A magnetron feeding apparatus described in claim 1, wherein said output voltage detector uses one portion of an output winding of the high-tension transformer as a detection winding so as to detect the output voltage.

9. A magnetron feeding apparatus described in claim 2, further comprising a first gradual increasing means for controlling so that the output voltage information or the input current information is gradually increased to the power controlling means.

10. A magnetron feeding apparatus described in claim 3, further comprising a second gradual increasing means for controlling so that the output voltage information or the input current information may be gradually increased to the power controlling means.

11. A magnetron feeding apparatus described in claim 1, further comprising a third comparing means for comparing the output voltage information with a sixth given value, a third gradual increasing means for controlling so that the input current information is gradually increased to a seventh given value when the output voltage information is small with respect to the sixth given value, a first gradual decreasing means for controlling so that a preselected current information may be gradually decreasing when the output voltage information is large with respect to the sixth given value.

12. A magnetron feeding apparatus described in claim 4, wherein said input current detector is adapted to detect the input current from the commercial power supply.

13. A magnetron feeding apparatus described in claim 1, further comprising a rectification circuit connected between the high-tension transformer and the magnetron.

14. A magnetron feeding apparatus comprising a power-supply for feeding a DC current, an inverter circuit for converting the DC current into high-frequency power through the switching operation of a semiconductor switch, a high-tension transformer which converts the high-frequency power into high-tension power to be supplied to a magnetron, an output voltage detector for detecting the output voltage of the high-tension transformer, an input current detector for detecting the input current into the inverter circuit, and a software processor for forming the driving pulses of the semiconductor switch using the output voltage information of the output voltage detector and the input current information of the input current detector.

15. A method of controlling said magnetron feeding apparatus described in claim 14, having in said software processor a program flow comprising the steps of performing an initial setting of inner data after the power supply has been put into operation, and thereafter repeating the inputting operation of the output voltage information and the input current information, the data forming operation for setting an on time to form, using the inputted output voltage and input current information, the data for setting the on time of the semiconductor switch, and a driving pulse outputting operation for setting the pulse width of the driving pulse which turns the semiconductor switch on and off using the data used for the on time setting.

16. A method of controlling said magnetron feeding apparatus described in claim 15, having in said software processor a program flow comprising the steps of starting a timer on for setting the timer time at the value of the on time setting data, outputting driving pulses for turning on the semiconductor switch, detecting the completion of the timer on to output driving pulses for turning off the semiconductor, starting the timer off of the timer time of the given value, and returning to the start of the timer on through the detection of the completion of the timer off.

17. A method of controlling said magnetic feeding apparatus described in claim 15, having in said software processor a program flow comprising the steps of inputting the output voltage information and the input voltage information, selecting the information of the larger value through the comparison between said output and input voltage information, comparing the information of the larger value and a first given value to decrease the data for the on time setting use when the information is larger than the first given value, and increasing the data for on time setting use when it is smaller than the first given value.

18. A method of controlling said magnetron feeding apparatus described in claim 15, having in said software processor program flow comprising the steps of inputting output voltage information, comparing the output voltage information with a second given value to decrease a predetermined data V for the on time setting use when it is larger than the second given value, increasing the data V for the on time setting use when it is smaller than the second given value, a program flow comprising the steps of inputting the input current information, comparing the input current information with a third given value to decrease a predetermined data I for the on time setting use when it is larger than the third given value, increasing the data I for the on time setting use when it is smaller than the third given value and a program flow comprising the steps of comparing the data V for on time setting use with the data I for the on time setting use, having the data of smaller value as the data for the on time setting use.

19. A method of controlling said magnetron feeding apparatus described in claim 15, having in said software processor a program flow comprising the steps of inputting the output voltage information, comparing the output voltage information with a fourth given value to decrease the current reference information when it is larger than the fourth given value, to increase the current reference information when it is smaller than the fourth given value, and restricting to a fifth given value the largest of the increased current reference information, a program flow comprising the steps of inputting the input current information, comparing the input current information with the current reference information to decrease the data for the on time setting use when it is larger than the current reference information, to increase the data for the on time setting use when it is smaller than the current reference information.

* * * * *